(12) United States Patent
Rubin et al.

(10) Patent No.: US 7,498,508 B2
(45) Date of Patent: Mar. 3, 2009

(54) HIGH VOLTAGE SOLAR CELL AND SOLAR CELL MODULE

(75) Inventors: Leonid B. Rubin, Burnaby (CA);
George L. Rubin, Burnaby (CA);
Andreas Schneider, Burnaby (CA);
Alexander S Osipov, New Westminster (CA)

(73) Assignee: Day4 Energy, Inc., Burnaby (CA)

( * ) Notice: Subject to any disclaimer, the term of this patent is extended or adjusted under 35 U.S.C. 154(b) by 0 days.

(21) Appl. No.: 11/361,296

(22) Filed: Feb. 24, 2006

(65) Prior Publication Data
US 2007/0199588 A1    Aug. 30, 2007

(51) Int. Cl.
*H01L 31/00* (2006.01)
(52) U.S. Cl. .................................. 136/256; 136/249
(58) Field of Classification Search .................. 136/244, 136/249, 255–256
See application file for complete search history.

(56) References Cited

U.S. PATENT DOCUMENTS

| | | | |
|---|---|---|---|
| 3,982,964 | A | 9/1976 | Lindmayer et al. |
| 3,996,067 | A | 12/1976 | Broder |
| 4,173,496 | A | 11/1979 | Chiang et al. |
| 4,200,472 | A | 4/1980 | Chappell et al. |
| 4,278,473 | A | 7/1981 | Borden |
| 4,291,191 | A | 9/1981 | Dahlberg |
| 4,315,096 | A * | 2/1982 | Tyan et al. ................. 136/244 |
| 4,320,154 | A | 3/1982 | Biter |
| 4,330,680 | A | 5/1982 | Goetzberger |
| 4,341,918 | A * | 7/1982 | Evans et al. ................. 136/249 |
| 4,376,872 | A | 3/1983 | Evans et al. |
| 4,380,112 | A | 4/1983 | Little |
| 4,499,658 | A * | 2/1985 | Lewis ........................ 438/64 |

(Continued)

FOREIGN PATENT DOCUMENTS

DE    10239845 C1    12/2003

(Continued)

OTHER PUBLICATIONS

Website "Wiring solar modules and batteries", http://www.partsonsale.com/learnwiring.htm from Feb. 6, 2003, available from www.archive.org, 4 pages.*

(Continued)

*Primary Examiner*—Nam X Nguyen
*Assistant Examiner*—Jeffrey T. Barton
(74) *Attorney, Agent, or Firm*—Knobbe, Martens, Olson & Bear, LLP

(57) ABSTRACT

A solar cell apparatus and process for making and using same involving a semiconductor wafer having a front side surface and a metallized back side surface and a semiconductor p/n junction between the front side surface and the back side surface. At least one front side interruption is caused to extend along at least a portion of the front side surface and into the wafer to a depth sufficient to interrupt the semiconductor p/n junction to define a plurality of separate p/n junction sections within the wafer and to define separate front side surface portions associated with respective separate p/n junction sections. A back side interruption is caused to extend along a portion of the metallized back side surface, generally opposite the front side interruption, to define a plurality of separate metallized back side surface portions associated with respective p/n junction sections and in electrical contact with respective p/n junction sections.

53 Claims, 13 Drawing Sheets

U.S. PATENT DOCUMENTS

| | | |
|---|---|---|
| 4,517,403 A | 5/1985 | Morel et al. |
| 4,603,470 A | 8/1986 | Yamazaki |
| 4,697,041 A * | 9/1987 | Okaniwa et al. ............ 136/244 |
| 4,735,662 A | 4/1988 | Szabo et al. |
| 4,933,021 A | 6/1990 | Swanson |
| 5,009,720 A | 4/1991 | Hokuyo et al. |
| 5,078,803 A | 1/1992 | Pier et al. |
| 5,084,107 A | 1/1992 | Deguchi et al. |
| 5,158,618 A | 10/1992 | Rubin et al. |
| 5,164,019 A | 11/1992 | Sinton |
| 5,223,044 A | 6/1993 | Asai |
| 5,248,347 A | 9/1993 | Ochi |
| 5,330,583 A | 7/1994 | Asai et al. |
| 5,389,158 A | 2/1995 | Fraas et al. |
| 5,391,236 A * | 2/1995 | Krut et al. .................... 136/249 |
| 5,457,057 A | 10/1995 | Nath et al. |
| 5,616,185 A | 4/1997 | Kukulka |
| 5,681,402 A | 10/1997 | Ichinose et al. |
| 5,759,291 A | 6/1998 | Ichinose et al. |
| 5,871,591 A | 2/1999 | Ruby et al. |
| 5,942,048 A | 8/1999 | Fujisaki et al. |
| 5,990,415 A | 11/1999 | Green et al. |
| 6,091,021 A | 7/2000 | Ruby et al. |
| 6,093,882 A | 7/2000 | Arimoto |
| 6,121,542 A | 9/2000 | Shiotsuka et al. |
| 6,172,297 B1 | 1/2001 | Hezel et al. |
| 6,184,458 B1 | 2/2001 | Murakami et al. |
| 6,379,995 B1 | 4/2002 | Kawama et al. |
| 6,384,313 B2 | 5/2002 | Nakagawa et al. |
| 6,441,297 B1 | 8/2002 | Keller et al. |
| 6,452,086 B1 | 9/2002 | Müller |
| 6,541,695 B1 | 4/2003 | Mowles |
| 6,552,414 B1 | 4/2003 | Horzel et al. |
| 6,982,218 B2 | 7/2003 | Preu et al. |
| 6,620,645 B2 | 9/2003 | Chandra et al. |
| 6,663,944 B2 | 12/2003 | Park et al. |
| 6,690,041 B2 | 2/2004 | Armstrong et al. |
| 6,756,290 B1 | 6/2004 | Bultman |
| 6,784,358 B2 | 8/2004 | Kukulka |
| 6,803,513 B2 | 10/2004 | Beernink et al. |
| 6,825,104 B2 | 11/2004 | Horzel et al. |
| 7,030,410 B2 | 4/2006 | Moore |
| 7,087,834 B2 | 8/2006 | McFarland |
| 7,115,504 B2 | 10/2006 | Moore et al. |
| 2002/0164834 A1 | 11/2002 | Boutros et al. |
| 2003/0134469 A1 | 7/2003 | Horzel et al. |
| 2004/0123897 A1 | 7/2004 | Ojima et al. |
| 2005/0087224 A1 | 4/2005 | McFarland |
| 2005/0241692 A1 | 11/2005 | Rubin et al. |
| 2006/0022192 A1 | 2/2006 | Brabec et al. |
| 2006/0255340 A1 | 11/2006 | Manivannan et al. |

FOREIGN PATENT DOCUMENTS

| | | |
|---|---|---|
| EP | 0807980 A | 11/1997 |
| JP | 59115576 A2 | 7/1984 |
| JP | 01206671 A2 | 2/1988 |
| JP | 07321351 A | 12/1995 |
| WO | WO 2004/021455 A1 | 3/2004 |

OTHER PUBLICATIONS

Raabe et al., High Aspect Ratio Screen Printed Fingers, Proc. Of the 20th European Photovoltaic Solar Energy Conference, Jun. 6-10, 2005, Barcelona, Spain.

Hoornstra et al., The Importance of Paste Rheology in Improving Fine Line, Thick Film Screen Printing of Front Side Metallization, Proc. Of the 14th European Photovoltaic Solar Energy Conference, Jun.30-Jul. 4, 1997, Barcelona, Spain.

Burgers et al., Interruption Tolerance of Metallization Patterns, Proc. Of the 12th European Photovoltaic Solar Energy Conference, Apr. 11-15, 1994, Amsterdam, The Netherlands.

Hammud et al., "Monolithically Series-Connected Crystalline SI Wafer Cells for Portable Electronic Devices", 31st IEEE Photovaltaic Specialists Conference 2005, IEEE Catalog No. 05CH37608C; ISBN 0-7803-8708-5.

* cited by examiner

HIGH VOLTAGE SOLAR CELL AND SOLAR CELL MODULE

BACKGROUND OF THE INVENTION

1. Field of Invention

This invention relates to high voltage solar cells, apparatus for use in forming a high voltage solar cell, a process for forming the apparatus and a process for using the apparatus.

2. Description of Related Art

It is well-known that under light illumination photovoltaic (PV) solar cells generate direct electric current (DC) at a certain voltage. Current solar cells produced by standard photovoltaic cell manufacturing processes that use crystalline silicon semiconductor material usually generate an electrical short circuit current density (Jsc) of about 32-36 mA/cm$^2$ and an open circuit voltage (Voc) of about 600-620 mV under standard illumination of 1000 W/m$^2$. In order to achieve a higher voltage output several photovoltaic (PV) cells must be interconnected in series to create a PV module.

Currently, most PV modules employ square or semi-square PV cells measuring about 4 to about 6 inches on a side. These cells generate a short circuit current (Isc) of up to about 3.5 A for the 4-inch cell to about 9A for the 6-inch cell at an open circuit voltage (Voc) of about 600 mV to about 620 mV, respectively. Recently introduced 8-inch PV cells generate even higher short circuit currents (Isc) up to about 15 A. These larger 8-inch cells have several advantages. One advantage is that production costs measured in dollars per watt of generated power are lower than with conventional smaller sized cells. In addition these larger cells have a greater potential efficiency due to the lower ratio of edge length to area.

In spite of these advantages PV module manufacturers are still reluctant to use 8-inch cells in module production because 8-inch cells generate very high electric current at low voltage and this requires provisions for very low resistance current collection on the front side of the cell in order to minimize voltage drops. This problem can be solved by using more current collecting bus-bars such as 3 bus-bars instead of the conventional 2 bus-bars. However the use of 3-bus-bars requires new tooling and equipment which increases manufacturing costs of these cells. In addition, the size of standard PV modules is limited by manufacturing processes and therefore the larger the area of cells used in a PV module, the smaller the number of cells that fit into the module, which limits the output voltage of the module, even if all cells are interconnected in series. As there is a growing need to convert DC power into AC power using inverters, DC input voltages must be on the order of 300V in order to achieve conversion efficiencies that are cost effective. Voltages in this range may be achieved only if at least 600 conventional PV cells are interconnected in series. Therefore the larger the size of PV cell incorporated into a PV module, the lower the number of cells and therefore the lower the voltage produced by the module relative to PV modules of the same area that employ PV cells with smaller areas.

Conventional approaches to solve this problem involve dividing PV cells in such a way that mechanical integrity is preserved while the cell performs electrically as though it were more than one cell. There are various ways of achieving this.

U.S. Pat. No. 5,164,019 to Sinton entitled "Monolithic Series-Connected Solar Cells having Improved Cell Insulation and Process of Making the Same" describes an array of series-connected PV sub-cells that are built in a monolithic semiconductor substrate and electrically insulated from each other by grooves in the cell surface. The grooves that separate sub-cells are produced either on a front or on a back side of the semiconductor substrate and the depth of the groove is controlled to create a crack inside the semiconductor bulk material to completely break the semiconductor substrate between the sub-cells. Mechanical integrity is provided by metallization that interconnects the PV sub-cells. Since this technology requires a complete break in the substrate the final product is very fragile. This technology is quite complicated and expensive, and may not be cost effective for large-scale production of PV cells and PV modules.

U.S. Pat. No. 4,933,021 to Swanson entitled "Monolithic Series-Connected Solar Cells Employing Shorted p/n Junctions for Electrical Insulation" describes the use of electrical insulation between PV sub-cells on a single substrate by forming a plurality of p/n junctions in the substrate between adjacent sub-cells and shorting the p/n junctions by metallization serially interconnecting adjacent sub-cells. Again, this technology is quite expensive and probably not cost effective for large-size PV devices.

U.S. Pat. No. 4,376,872 to Evans, et al. entitled "High voltage V-groove solar cell" describes a high voltage multifunction solar cell comprising a plurality of discrete voltage generating regions or unit cells which are formed in a single semiconductor wafer and which are connected together so that the voltages of the individual cells are additive. The unit cells comprise doped regions of opposite conductivity types separated by a gap. V-shaped grooves are formed in the wafer and configured so that ions of one conductivity type can travel in one face of a groove while the other face is shielded. The V-shaped grooves function to interconnect the unit cells in series rather than to separate the unit cells. This process is complex and probably not cost effective for mass production of photovoltaic cells.

U.S. Pat. No. 4,278,473 to Borden entitled "Monolithic series-connected solar cell" describes monolithic series-connected solar sub-cells that are defined as separate sub-cells by electrochemically produced grooves that penetrate from a top surface into the semiconductor substrate to an insulating substrate. The grooves have walls on which interconnections between sub-cells are formed by providing a connection from a top part of a cell to a contact ledge formed in a base region of an adjoining cell. This technology is complicated, expensive and likely applicable only for small electronic and photovoltaic devices.

U.S. Pat. No. 4,173,496 to Chiang, et al. entitled "Integrated Solar Cell Array" describes an integrated, monolithic array of solar cells wherein isolation between cells permits series interconnection of the cell to provide an output voltage for the array equal to the sum of the voltage of the unit cells. Isolation is provided between neighboring cells by a pattern of grooves having walls that are subsequently coated with metallization, an oxide layer and selective doping to create P+ and N+ regions to provide an electrical connection between cells and to eliminate spurious shunt current between them. This technology is complicated, expensive and likely applicable only for an integrated monolithic array of solar cells and potentially inefficient for large PV cells and modules.

U.S. Pat. No. 4,603,470 to Yamazaki entitled "Method of Making Plurality of Series Connected Solar Cells Using Multiple Groove Forming Processes" describes a method for interconnecting a plurality of non-single-crystal semiconductor solar cells by forming a plurality of grooves in a metallization layer of a substrate. The grooves do not appear to penetrate into the bulk of the substrate. This technology cannot be applied on crystalline silicon semiconductors and therefore is unlikely to be applicable to mass produced PV cells and modules.

U.S. Pat. No. 4,517,403 to Morel, et al. entitled "Series Connected Solar Cells and Process of Formation" describes a photovoltaic device that has a continuous thin film with a plurality of spaced photovoltaic regions thereon and front and back electrode portions associated with each of the photovoltaic regions. Electrical connection between the regions is provided directly through the film itself, from each back electrode portion to the front electrode portion of an adjacent region. Thus, at least two of the photovoltaic regions are connected in series to increase the output voltage of the device. This technology is applicable to thin film semiconductor material and would probably not be used for mass production of PV cells and modules.

An article entitled "Monolithically Series-Connected Crystalline Si Wafer Cells for Portable Electronic Devices" (Adam Hammud, Barbara Terheiden, Richard Auer and Rolf Brendel: 31$^{st}$ IEEE Photovoltaic Specialists Conference 2005, IEEE Catalog No: 05CH37608C, ISBN: 0-7803-8708-5) describes a simple process for the fabrication of solar mini-modules from crystalline Si wafers. This process involves p/n junction formation, passivation by plasma enhanced chemical vapor deposition, selective plasma etching, electrical interconnection between a semiconductor emitter and base by aluminum evaporation, Si-wafer fixation on glass substrate and creation of separated solar PV sub-cells by dicing and subsequent plasma etching. The best out of thirty PV modules comprised of 6 series-connected PV sub-cells is described to provide an efficiency of 11% and an open circuit voltage (Voc) of 3.624V. This technology appears to relate to separation of complete sub-cells by dicing and affixing the individual sub-cells onto the glass substrate. Although the authors claimed that the technology is simple it may be too complicated and expensive to satisfy PV industry requirements.

U.S. Pat. No. 4,330,680 to Goetzberger entitled "Integrated series-connected solar cell" describes a row of strip-shaped semiconductor junctions arranged on each of two surfaces of a semiconductor substrate possessing a high ohmic resistance. The junctions alternate in having p+ and n+ conduction characteristics and are parallel to each other and spaced apart at intervals in such a way that a semiconductor junction having a p+-conduction characteristic on one surface of the semiconductor substrate is located opposite a semiconductor junction having an n+ conduction characteristic on the other surface, for example. Printed circuit tracks are arranged on the substrate to connect, in each case, one set of solar cell junctions with a neighboring set, in series connection. Essentially, this technology provides a way to interconnect solar cells in series by means of proper fabrication of p+ and n+ conductive regions on the semiconductor substrate. This technology is strongly dependent on complicated and expensive microelectronic equipment and is unlikely to be cost-effective to satisfy PV industry requirements.

U.S. Pat. No. 6,441,297 to Keller, et al entitled "Solar Cell Arrangement" describes a solar cell arrangement comprising series-connected solar PV sub-cells. A semiconductor wafer acts as a common base material for a plurality of solar PV sub-cells. Recesses are provided in the wafer for delimiting individual, series-connected solar PV sub-cells. Some of the recesses extend from the top surface of the semiconductor wafer, through the wafer itself to the bottom surface and some bridge segments are left to continue the recesses as far as the wafer edge, to mechanically interconnect the sub-cells. This technology requires dicing which weakens the semiconductor wafer making the final product fragile and requiring mounting on a solid substrate.

Generally, the above references employ mechanical and/or microelectronic process of treating a common semiconductor substrate, to create PV sub-cells interconnected in-series on the semiconductor substrate itself, however, generally each reference describes sophisticated and expensive technologies that are unlikely to be practical for large scale PV module fabrication using large wafers.

SUMMARY OF THE INVENTION

In accordance with one aspect of the invention, there is provided a solar cell apparatus. The apparatus includes a semiconductor wafer having a front side surface, a metallized back side surface and a semiconductor p/n junction therewithin, between the front side surface and the back side surface. The wafer further includes at least one front side interruption extending along at least a portion of the front side surface and extending into the wafer to a depth sufficient to interrupt the semiconductor p/n junction to define a plurality of separate p/n junction sections within the wafer and to define separate front side surface portions associated with respective separate p/n junction sections. The wafer further includes a back side interruption extending along a portion of the metallized back side surface, generally opposite the front side interruption, to define a plurality of separate metallized back side surface portions associated with respective p/n junction sections and in electrical contact with respective p/n junction sections.

The semiconductor wafer may have at least one front side recess interrupting the semiconductor p/n junction. The at least one recess may include a first front side groove in the front side surface.

The wafer may have a perimeter edge and the front side groove may extend between two points on the perimeter edge. The two points may be on opposite edges of the wafer.

The back side interruption may include at least one metallization recess in the metallized back side surface, the metallization recess exposing an exposed portion of the back side surface of the wafer. The metallization recess may include a metallization groove and the front side groove and the metallization groove may be generally parallel to each other. The metallization groove may have a width greater than a width of the front side groove.

The back side interruption may further include a back side groove in the exposed portion of the back side surface. The front side groove and the back side groove may have axes that lie in a plane extending at an oblique angle to the front side surface. The metallization groove and the back side groove may have axes that are parallel and spaced apart.

The front side interruption may include a p/n junction barrier interrupting the semiconductor p/n junction. The p/n junction barrier may include a portion of the wafer in which a p/n junction has not been formed. The wafer may have a perimeter edge and the p/n junction barrier may extend between two points on the perimeter edge. The two points may be on opposite edges of the wafer.

The back side interruption may include at least one metallization recess in the metallized back side surface, the metallization recess exposing an exposed portion of the back side surface of the wafer. The metallization recess may include a metallization groove. The p/n junction barrier and the metallization groove may be generally parallel to each other.

The metallization groove may have a width and the p/n junction barrier may have a width and the metallization groove width may be greater than the p/n junction barrier width. The back side interruption may include a back side groove in the exposed portion of said back side surface. The p/n junction barrier and the back side groove may have axes that lie in a plane extending at an oblique angle to the front side surface. The metallization groove and the back side groove may have axes that are parallel and spaced apart.

The apparatus may further include respective sets of current collectors on respective front side surface portions, each of the respective sets of current collectors being in electrical contact with a respective p/n junction section. The current collectors in each set may include separate electrical contacts in the front side surface. The current collectors may be arranged in an array and/or may include a plurality of parallel spaced-apart fingers.

The apparatus may further comprise front side electrodes connected to respective sets of current collectors, each front side electrode including a front side terminator outside a perimeter of the semiconductor wafer, for connecting the corresponding semiconductor p/n junction section to a circuit.

Each of the front side electrodes may include at least one conductor having a portion extending outside a perimeter of the semiconductor wafer and the front side terminators associated with respective front side electrodes may include respective portions of the at least one conductor extending outside the perimeter of the semiconductor wafer.

Each of the front side terminators may include a respective front side bus and each of the front side electrodes may include a plurality of spaced apart electrical conductors each connected to a common front side bus.

The conductors of the plurality of conductors have terminating portions that extend beyond a perimeter edge of the semiconductor wafer and the conductors have portions that are connected to the common front side bus.

The front side electrodes may include an electrically insulating optically transparent film having a surface, an adhesive layer on the surface of the film for securing the film to a front side surface portion of the wafer. The plurality of spaced apart electrical conductors may be embedded into the adhesive layer and the electrical conductors may each have a conductor surface protruding from the adhesive layer, and an alloy bonding the electrical conductors to at least some of the electrical contacts in the front side surface portion such that current collected from the solar cell by the electrical contacts is gathered by the electrical conductors.

Each of the separate metallized back side surface portions may include metallization generally coextensive with and adjacent to a corresponding p/n junction section and in electrical contact therewith.

In accordance with another aspect of the invention, there is provided a high voltage solar cell module comprising the apparatus of any form as described above and further including back side electrodes connected to respective metallized back side surface portions, each back side electrode comprising a back side terminator outside a perimeter of the semiconductor wafer, for connecting the corresponding semiconductor p/n junction section to the circuit.

Each back side electrode may include at least one conductor having a portion extending outside a perimeter of the semiconductor wafer and the back side terminators associated with respective back side electrodes may include respective portions of the conductors extending outside the perimeter.

Each back side terminator may include a back side bus and may include a plurality of spaced apart electrical conductors each connected to a common back side bus.

The conductors of the plurality conductors may have terminating portions that extend beyond a perimeter edge of the semiconductor wafer and which are connected to the back side bus.

The back side electrode may include an electrically insulating film having a second surface, a second adhesive layer on the second surface for securing the film to a metallized back side surface portion, and the at least one electrical conductor may be embedded into the second adhesive layer and the at least one electrical conductor may have a second conductor surface protruding from the second adhesive layer, and an alloy bonding the at least one electrical conductor to the metallized exterior surface portion such that current supplied to the solar cell is supplied to the metallized exterior surface by the at least one electrical conductor.

In accordance with another aspect of the invention, there is provided a solar cell system comprising the solar cell apparatus with front and back side electrodes in any form described above and further including provisions for electrically connecting the front side terminator associated with the first semiconductor p/n junction section with the back side terminator of the second semiconductor p/n junction section to electrically connect the first and second semiconductor p/n junction sections in series.

The provisions for electrically connecting the front side terminator associated with the first semiconductor p/n junction section with the back side terminator of the second semiconductor p/n junction section may be operably configured to directly connect the front side terminator associated with the one semiconductor p/n junction section with the back side terminator associated with the second semiconductor p/n junction.

In accordance with another aspect of the invention, there is provided a solar cell system including first and second solar cell apparatus of any form described above disposed adjacent each other, and further including provisions for electrically connecting a front side terminator associated with a semiconductor p/n junction on the first apparatus with a back side terminator associated with a semiconductor p/n junction section on the second solar cell apparatus.

In accordance with another aspect of the invention, there is provided a process for fabricating a solar cell apparatus from a semiconductor wafer having a front side surface, a metallized back side surface and a p/n semiconductor junction therebetween. The process involves causing a front side interruption to extend along at least a portion of the front side surface and to extend into the wafer to a depth sufficient to interrupt the semiconductor p/n junction to define a plurality of separate p/n junction sections within the wafer and to define separate front side surface portions associated with respective separate p/n junction sections and causing a back side interruption to extend along a portion of the metallized back side surface, generally opposite the front side interruption, to define a plurality of separate metallized back side surface portions associated with respective said p/n junction sections and in electrical contact with respective p/n junction sections.

Causing a front side interruption to extend along at least a portion of the front side surface may involve forming at least one front side recess in the front side surface. Forming at least one recess may include forming a front side groove in the front side surface.

The wafer may have a perimeter edge and forming the front side recess may involve causing the front side recess to extend between two points on the perimeter edge. Causing the front side recess to extend between two points on the perimeter edge may involve causing the front side recess to extend between two points on opposite edges of the wafer.

Causing the back side interruption to extend along a portion of the back side metallized surface may involve forming at least one metallization recess in the metallized back side surface, the metallization recess exposing an exposed portion of the back side surface of the wafer. Forming the back side recess may involve forming a metallization groove in the metallized back side surface. Forming the front side groove and forming the metallization groove may involve causing the front side groove and the metallization groove to be generally parallel to each other. Forming the front side groove and the metallization groove may involve causing the metallization groove to have a width greater than a width of the front side groove.

Causing a back side interruption to extend along a portion of the metallized back side surface may involve forming a back side groove in the exposed portion of the back side surface. Forming the back side groove may involve forming the front side groove and the back side groove such that the front side groove and the back side groove have axes that lie in a plane extending at an oblique angle to the front side surface. Forming the back side groove may involve forming the back side groove such that the metallization groove and the back side groove have axes that are parallel and spaced apart.

Causing the front side interruption to extend along at least a portion of the front side surface may involve forming a p/n junction barrier in the front side surface.

Forming a p/n junction barrier may include causing a portion of the wafer to be shielded from p/n junction formation, the portion acting as the p/n junction barrier.

The wafer may have a perimeter edge and causing the p/n junction barrier to extend in a line may involve causing the p/n junction barrier to extend between two points on the perimeter edge. Causing the p/n junction barrier to extend between two points may involve causing the p/n junction barrier to extend between two points on opposite edge portions of the wafer.

Causing the back side interruption to extend along a portion of the metallized back side surface may involve forming at least one metallization recess in the metallized back side surface, the metallization recess exposing an exposed portion of the back side surface. Forming the metallization recess may involve forming a metallization groove. Forming the metallization groove may involve causing the p/n junction barrier and the metallization groove to extend generally parallel to each other. Forming the metallization groove may involve causing the metallization groove to have a width greater than a width of the p/n junction barrier.

Causing the back side interruption to extend in the metallized back side surface may involve forming a back side groove in the exposed portion of the back side surface. Forming the back side groove may involve causing the p/n junction barrier and the back side groove to have axes that lie in a plane extending at an oblique angle to the front side surface. Forming the back side groove may involve forming the back side groove such that the metallization groove and the back side groove have axes that are parallel and spaced apart.

The process may further involve forming respective sets of current collectors on respective front side surface portions, each of the respective sets of current collectors being in electrical contact with a respective p/n junction section. Forming the current collectors in each set may involve forming separate electrical contacts in each set, in the front side surface. Forming the electrical contacts may involve causing the electrical contacts to be arranged in an array. Forming the current collectors may involve forming a plurality of parallel spaced-apart fingers.

The process may further involve connecting front side electrodes to respective the sets of current collectors, each front side electrode comprising a front side terminator outside a perimeter of the semiconductor wafer, for connecting the corresponding semiconductor p/n junction section to a circuit.

In accordance with another aspect of the invention, there is provided a process for fabricating a high voltage solar cell module, the process involving any of the processes described above and further involving connecting back side electrodes to respective metallized back side surface portions, each back side electrode comprising a back side terminator outside a perimeter of the semiconductor wafer, for connecting the corresponding semiconductor p/n junction section to the circuit.

In accordance with another aspect of the invention, there is provided a process for fabricating a solar cell system. The process involves any of the processes recited above for fabricating a solar cell apparatus having front and back electrodes and further involving electrically connecting a front side terminator associated with a front side electrode associated with a first semiconductor p/n junction section in the wafer to a back side terminator of a back side electrode associated with a second semiconductor p/n junction section in the wafer to electrically connect the first and second semiconductor p/n junction sections in series.

Electrically connecting the front side terminator associated with the first semiconductor p/n junction section with the back side terminator associated with the second semiconductor p/n junction section comprises directly connecting the front side terminator associated with the first semiconductor p/n junction section with the back side terminator associated with the second semiconductor p/n junction.

In accordance with another aspect of the invention, there is provided a process for fabricating a high voltage solar cell system, using a solar cell module comprising a semiconductor wafer having a front side surface, a metallized back side surface, a semiconductor p/n junction between the front side surface and the back side surface, at least one front side interruption extending along at least a portion of the front side surface and extending into the wafer to a depth sufficient to interrupt the semiconductor p/n junction to define a plurality of separate p/n junction sections within the wafer and to define separate front side surface portions associated with respective separate p/n junction sections, a back side interruption extending along a portion of the metallized back side surface, generally opposite the front side interruption, to define a plurality of separate metallized back side surface portions associated with respective p/n junction sections and in electrical contact with respective p/n junction sections, respective sets of current collectors on respective front side surface portions, each of the respective sets of current collectors being in electrical contact with a respective p/n junction section, front side electrodes connected to respective sets of current collectors, each front side electrode comprising a front side terminator outside a perimeter of the semiconductor wafer, for connecting the corresponding semiconductor p/n junction section to a circuit and back side electrodes connected to respective metallized back side surface portions, each back side electrode comprising a back side terminator outside a perimeter of the semiconductor wafer, for connecting the corresponding semiconductor p/n junction section to the circuit. The process involves connecting one of the front side terminators associated with a first semiconductor p/n junction section to one of the back side terminators of a back side electrode associated with a second p/n junction section.

Connecting one of the front side terminators associated with a first semiconductor p/n junction section to one of the back side terminators of a back side electrode associated with a second p/n junction section may involve connecting one of the front side terminators associated with a first semiconductor p/n junction section to one of the back side terminators of a back side electrode associated with a second p/n junction section on the same wafer.

Connecting one of the front side terminators associated with a first semiconductor p/n junction section to one of the back side terminators of a back side electrode associated with a second p/n junction section may involve connecting one of said front side terminators associated with a first semiconductor p/n junction section to one of the back side terminators of a back side electrode associated with a second p/n junction section on a different wafer.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

In drawings which illustrate embodiments of the invention.

DETAILED DESCRIPTION

Figure 1:
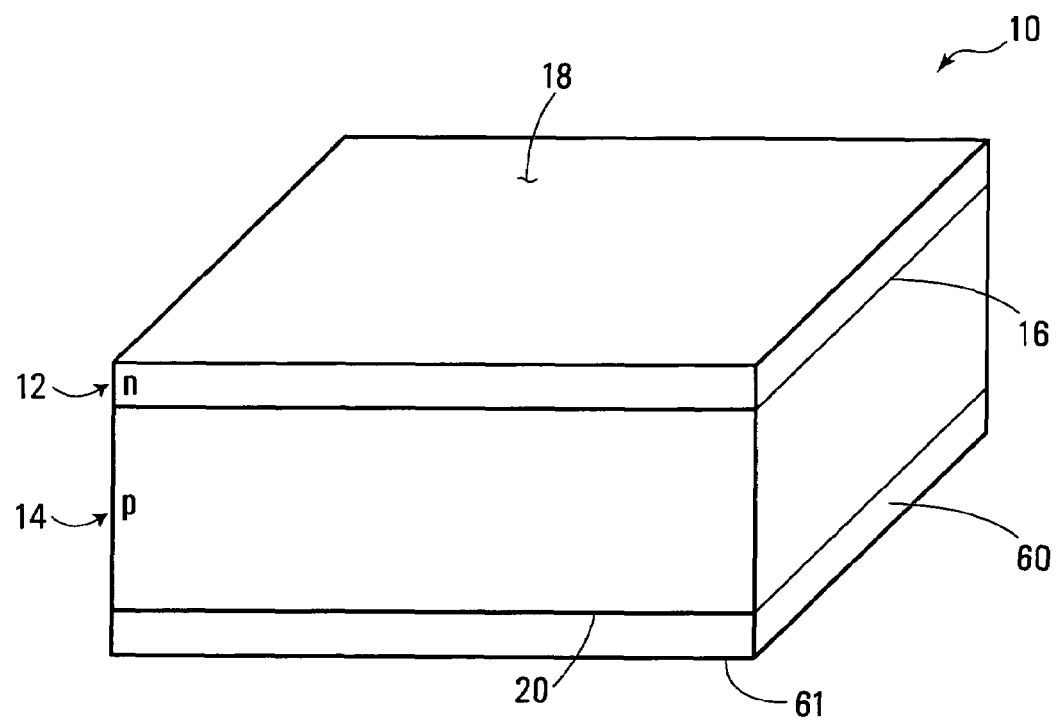
FIG. 1 is a perspective view of a semiconductor wafer used as a starting material for processes described herein for fabricating a high voltage solar cell module and high voltage solar cell system.

Referring to FIG. 1, a semiconductor wafer is shown generally at 10 and includes an n-type region 12 and a p-type region 14 that have been diffused into the wafer to form a semiconductor p/n junction 16 therebetween. Alternatively, the n-type region 12 and the p-type region 14 may be reversed. In the embodiment shown, the n-type region 12 has a thickness of approximately about 0.3 to about 0.6 micrometers and the p-type region 14 has a thickness of approximately about 200 to about 600 micrometers.

The semiconductor wafer 10 has a front side surface 18 and a metallized back side surface 61. The p/n semiconductor junction 16 is disposed therebetween. This semiconductor wafer 10 is a starting material for a process for fabricating a solar cell, according to one embodiment of the invention.

Figure 2:
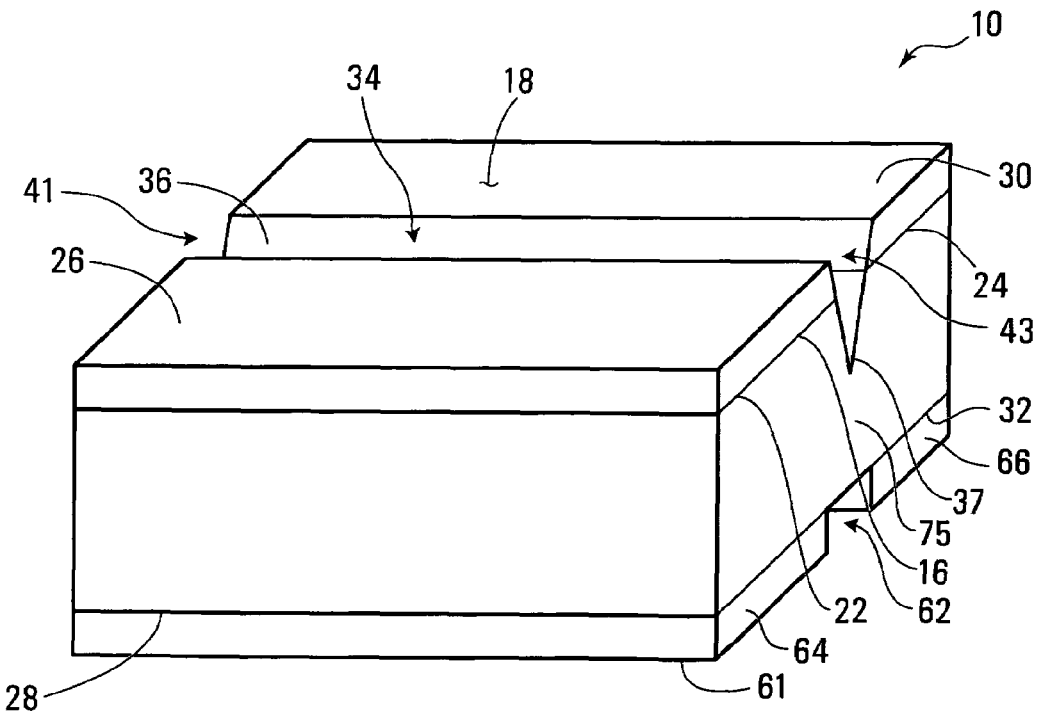
FIG. 2 is a perspective view of the wafer shown in FIG. 1 with a front side groove in a front side surface thereof according to one embodiment of the invention.

Referring to FIGS. 1 and 2, the process for fabricating a solar cell involves causing a front side interruption 34 to extend along at least a portion of the front side surface 18 and to extend into the wafer 10 to a depth sufficient to interrupt the semiconductor p/n junction 16 to define a plurality of separate p/n junction sections such as shown at 22 and 24, for example, within the wafer. The front side interruption 34 also defines separate front side surface portions 26 and 30, for example, associated with respective ones of the separate p/n junction sections 22 and 24.

The process also involves causing a back side interruption such as shown at 62 in FIG. 2 to extend along a portion of the metallized back side surface 61, generally opposite the front side interruption 34, to define a plurality of separate metallized back side surface portions such as shown at 64 and 66, for example, associated with respective ones of the p/n junction sections 22 and 24 and in electrical contact with their respective p/n junction sections.

Causing a front side interruption to extend along at least a portion of the front side surface may be achieved by forming at least one front side recess such as shown generally at 34 in FIG. 2, in the front side 18 of the semiconductor wafer 10. The recess 34 in this embodiment comprises a front side groove 36 in the front side surface 18 of the overall wafer 10.

The front side groove 36 may be formed by laser cutting into the front side surface 18 to a sufficient depth that the groove extends into and through the semiconductor p/n junction 16. Generally, it is desirable to make the depth of the front side groove 36 as deep as possible, but not so deep that the mechanical integrity of the wafer 10 is compromised. It will be appreciated that forming a groove as indicated leaves only a thin bulk contacting portion 75 of material connecting adjacent portions of the semiconductor wafer 10 together and, of course, the smaller this thin portion, the greater the chance of fracture of the wafer in this area. Laser cutting of the front side groove 36 is a desirable way of forming the groove as this generally introduces the least damage to the wafer 10 and minimizes energy losses due to edge effects created by the edges of the groove, during operation.

In the embodiment shown, the front side recess 34 (i.e., groove 36) extends between two points 41 and 43 on a perimeter edge 45 of the wafer 10 and more particularly on opposite edge portions of the wafer. The groove thus separates the front side surface 18 into first and second surface portions 26 and 30.

Alternatively, the front side groove 36 may be formed by wet etching or by mechanical saw dicing, for example.

Figure 3:
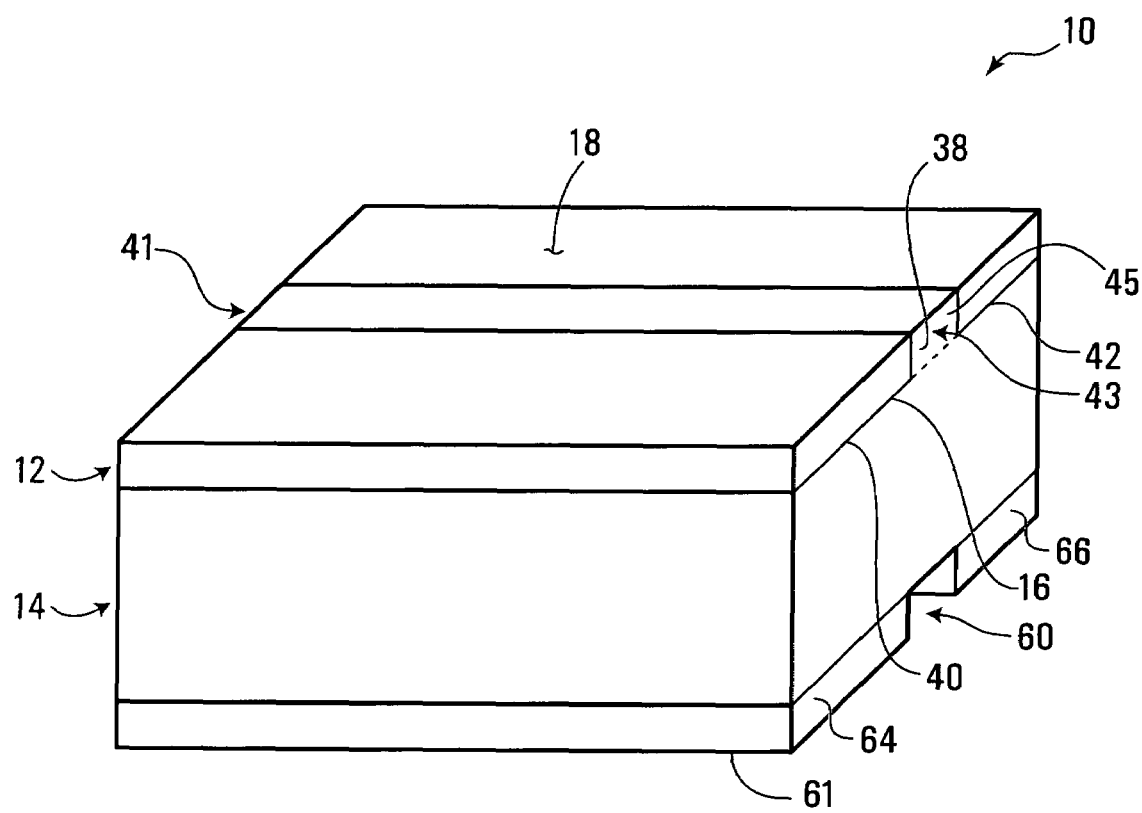
FIG. 3 is a perspective view of the wafer of FIG. 1 with a front side p/n junction barrier in a front side surface thereof according to an alternative embodiment of the invention.

Referring to FIG. 3, an alternative method for interrupting the semiconductor p/n junction 16 involves the formation of a p/n junction barrier 38 in the front side surface 18 of the wafer 10. In one embodiment, forming the p/n junction barrier 38 may comprise the use of conventional microelectronic technology to place silicon dioxide on the front side surface. A narrow line of silicon dioxide at least as thick as the intended depth of the junction may be formed on the bulk semiconductor material (the p-type material 14 in this case) before any p/n junction is formed, the line extending between two points on the perimeter edge of the wafer and more particularly in this embodiment, between two points on opposite edge portions of the wafer. Then, with the narrow line of silicon dioxide formed on the surface of the semiconductor wafer 10, the semiconductor wafer 10 is subjected to the usual doping processes that form a p/n junction. The line of silicon dioxide shields diffusion of dopant into the semiconductor material 45 directly under the line, thereby preventing p/n junction formation in that area. Effectively, the semiconductor material 45 directly beneath the line of silicon dioxide remains generally in its original state and acts as a p/n junction barrier 38, while separate p/n junction sections 40 and 42 are formed in the bulk material on opposite sides of the barrier 38. These separate p/n junction sections 40 and 42 extend generally in a plane between the front side surface and the back side surface of the wafer. In effect, the p/n junction sections 40 and 42 act as separate p/n junction sections of an otherwise continuous p/n junction 16 that would be formed in the semiconductor wafer 10.

Figure 20:
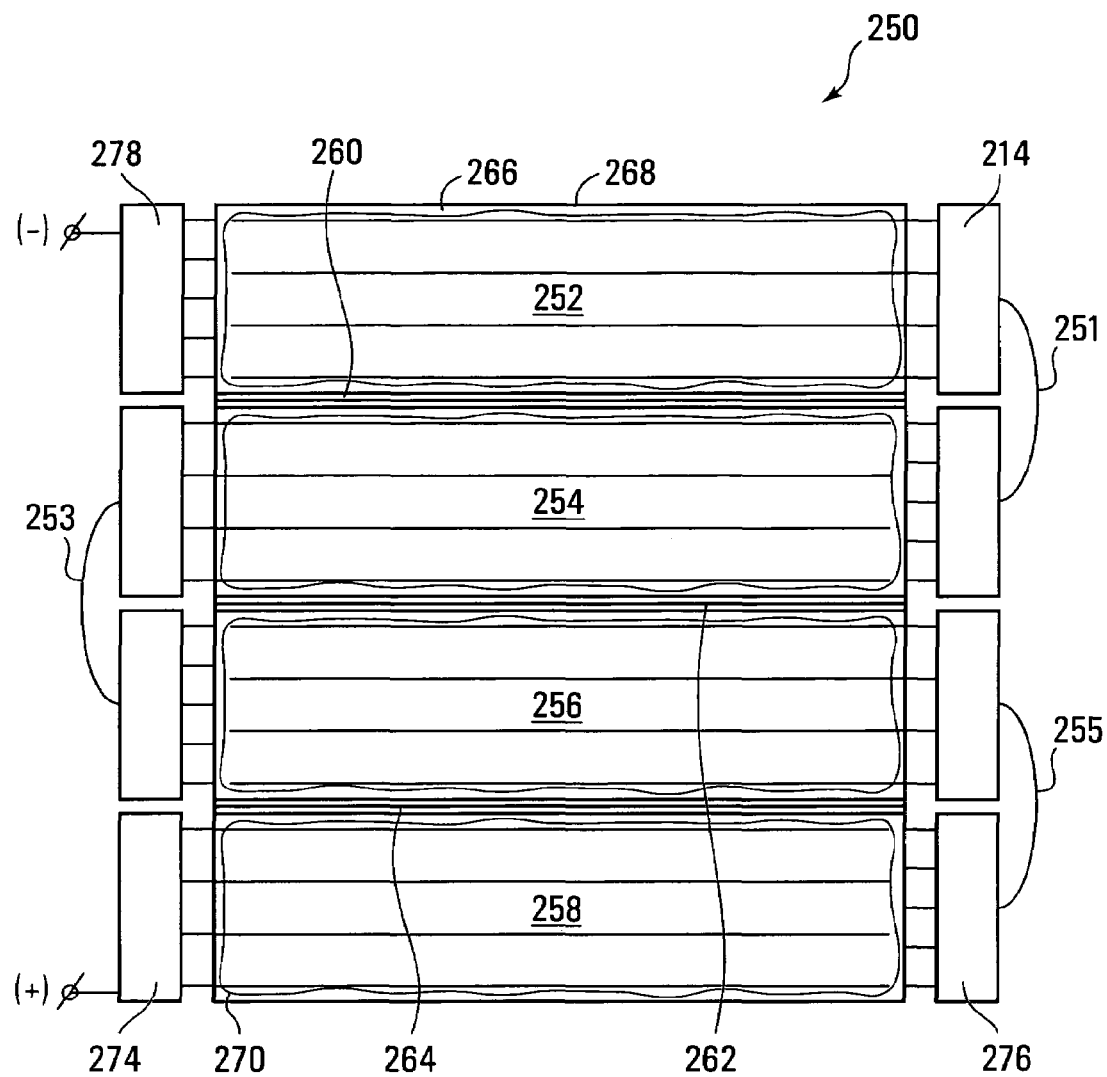
FIG. 20 is a schematic view of the apparatus shown in FIG. 1, in which a semiconductor p/n junction thereof is divided into four semiconductor p/n junction sections and the semiconductor p/n junction sections are connected together in series.

As shown in FIGS. 2 and 3, only a single front side groove 36 or portion of undoped bulk material 45 is used to separate the semiconductor p/n junction 16 into separate p/n junction sections. It will be appreciated that additional grooves and/or additional portions of undoped bulk material may be used to further divide the semiconductor p/n junction into a greater number of separate semiconductor p/n junction sections, such as shown in FIG. 20.

Figure 4:
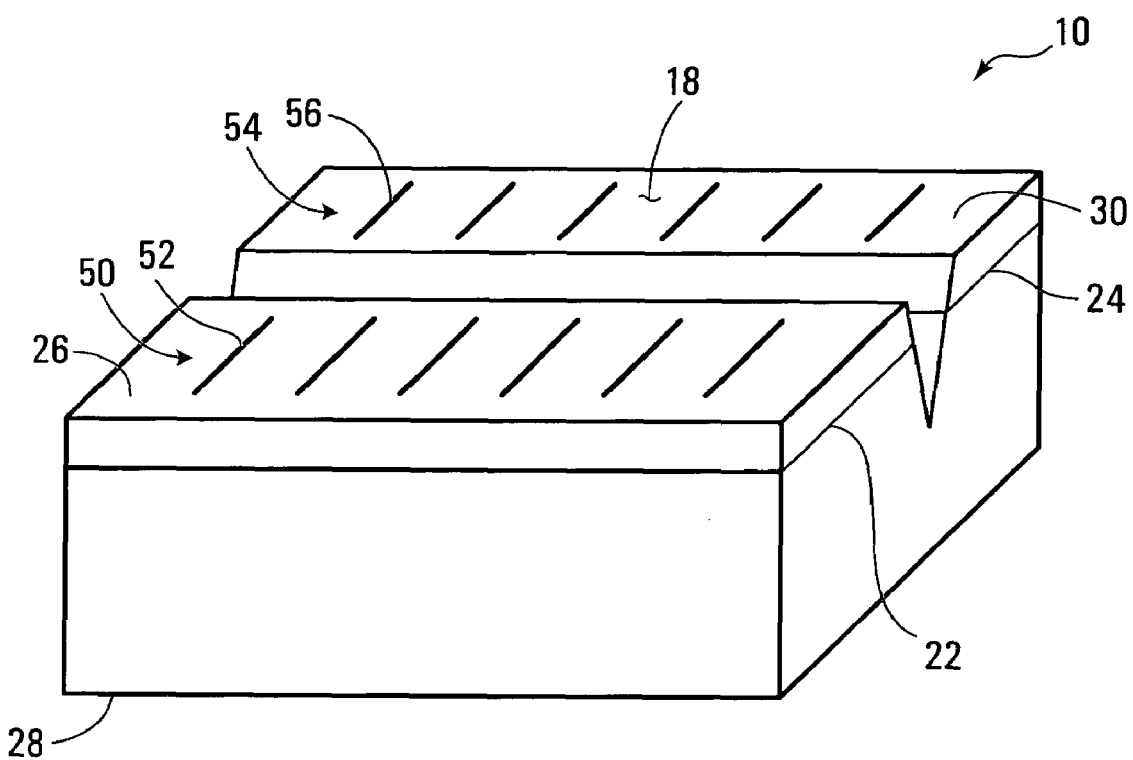
FIG. 4 is a perspective view of the wafer of FIG. 2 after formation of sets of current collectors on respective semiconductor p/n junction sections of the wafer shown in FIG. 2.

Referring to FIG. 4, the process for fabricating the solar cell may further involve forming respective sets of current collectors on respective front side surface portions 26 and 30 of the wafer 10 where each set is adjacent a corresponding p/n junction section 22 and 24 and in electrical contact with the corresponding p/n junction section. In FIG. 4, a first set 50 of current collectors, including contacts such as shown at 52, is formed on the first front side surface portion 26 associated with the first semiconductor p/n junction section 22 and a second set 54 of current collectors, including contacts such as shown at 56, for example, is formed on the second front side surface portion 30 associated with the second semiconductor p/n junction 24.

In this embodiment, the current collectors of the first and second sets 50 and 54 include a plurality of spaced apart line contacts, commonly known as fingers, which are formed, for example, by screen printing a conductive paste in lines, as shown, on the front side surfaces 26 and 30 and then causing the paste to diffuse into the front side surfaces until it reaches but does not penetrate through the p/n junction sections 22 and 24, thus, placing the contacts 52 and 56 in electrical contact with the p/n junction sections 22 and 24, respectively. The sets of current collectors 50 and 54 serve to collect current from the p/n junction sections 22 and 24, respectively.

The contacts 52 and 56 may be formed in an array such as shown in FIG. 4, for example, where the fingers are spaced evenly apart, in parallel relation.

Similar sets of current collectors are formed on the front side surfaces associated with all other respective semiconductor p/n junction sections formed in the wafer.

Figure 5:
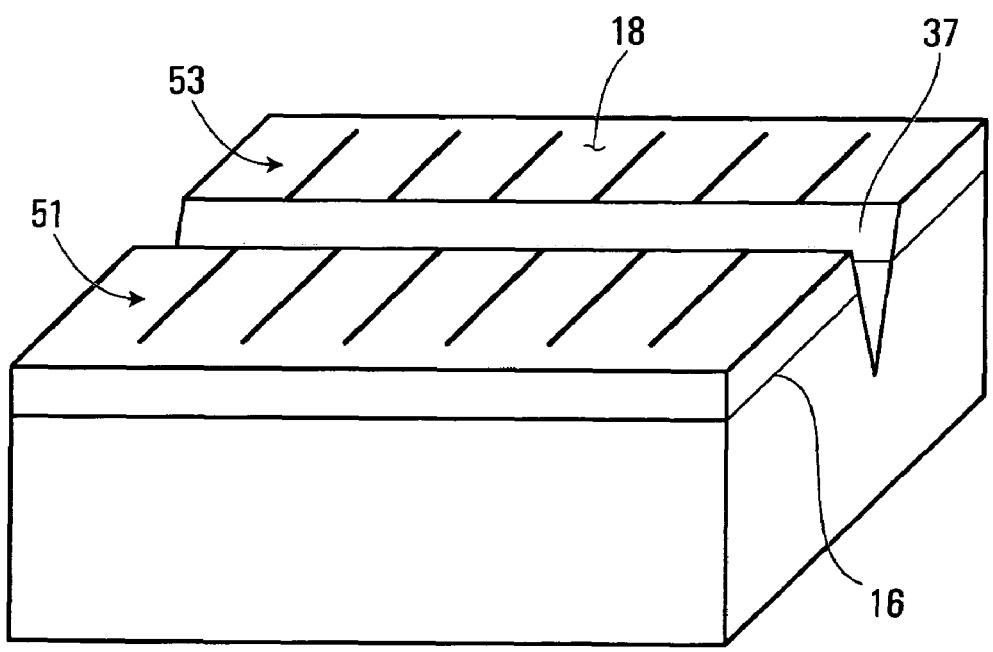
FIG. 5 is a perspective view of a semiconductor wafer in which separate sets of current collectors have been formed prior to groove formation, according to an alternative embodiment of the invention.

Alternatively, as shown in FIG. 5, sets 51 and 53 of current collectors may have already been formed on the front side surface 18 of the semiconductor wafer shown in FIG. 1, as a single set of spaced apart line contacts, which are then interrupted by the formation of a front side groove 37, for interrupting the semiconductor p/n junction 16.

Further details of alternate current collectors are described in U.S. patent application Ser. No. 11/317,530 filed Dec. 23, 2005, which is incorporated herein by reference.

Figure 6:
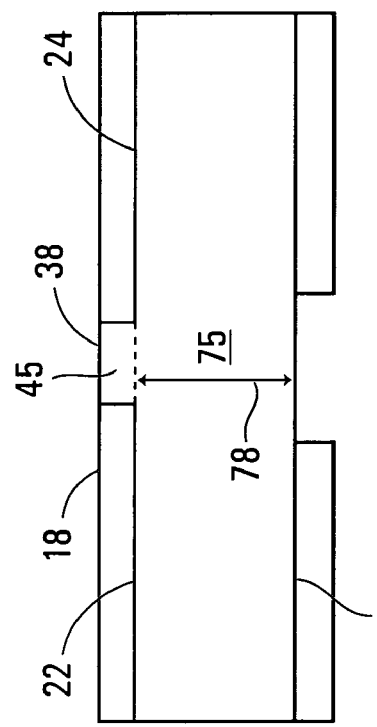
FIG. 6 is a side view of the wafer shown in FIG. 4 with back side metallization and a front side groove.
Figure 7:
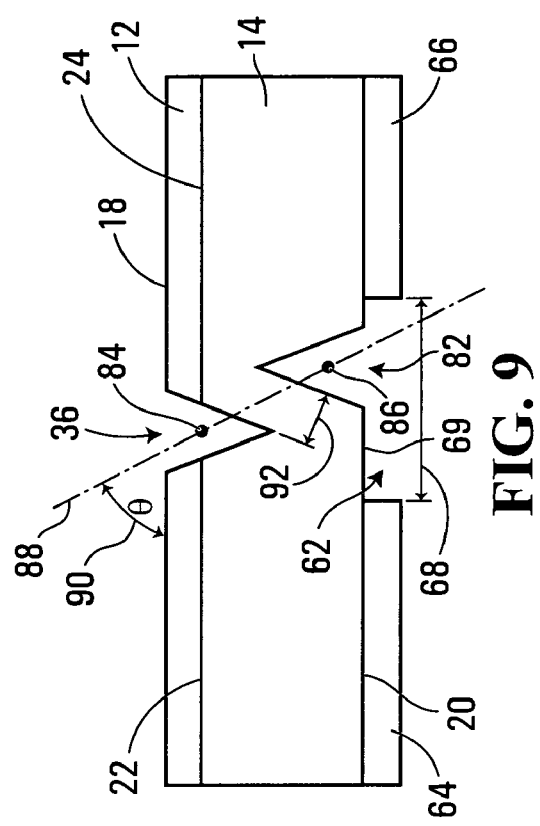
FIG. 7 is a side view of the wafer shown in FIG. 6 with a metallization groove in the back side metallization.

Referring to FIG. 6, the wafer 10 may be initially provided with a uniform layer of metallization 60 that extends all across the back side surface 20 of the wafer 10. As part of the process described herein, a back side interruption is formed in this layer of metallization by forming a metallization recess 62 which, in this embodiment, includes a groove in the metallization layer 60 such that the groove extends parallel to the front side groove 36 in the front side surface 18. The metallization recess 62 thus forms first and second metallized exterior surface portions 64 and 66 that are generally coextensive with, in contact with, and adjacent to corresponding p/n junction sections 22 and 24 as shown in FIG. 7.

Alternatively, before metallizing the back side surface of the wafer, a mask (not shown) may be placed in the area where the metallization groove 62, or other separation between the first and second metallized areas 64 and 66 is to lie and then separately forming the metallized areas 64 and 66 on the back side 20 of the wafer 10. Either way, the metallization recess exposes an exposed portion 69 of the back side surface 20 on which there is no metallization and no highly doped areas of n+ or p+ material.

In the embodiment shown, the metallization groove 62 is directly beneath the front side groove 36 in the front side surface 18 and thus, the front side groove 36 and the metallization groove 62 are generally parallel to each other and extend across the entire wafer, from edge to opposite edge. Desirably, the metallization groove 62 has a width 68 greater than a width 70 of the front side groove 36.

Still referring to FIG. 7, it will be appreciated that the front side groove 36 has a deepest point 72 that extends a depth 74 into the semiconductor wafer 10, specifically into the bulk (p-type) material 14, below the interrupted p/n junction sections 22 and 24. A distance 76 between this deepest point 72 and the back side surface 20 defines the bulk contacting portion 75 which, as stated above, is desirably kept to a minimum, but not so small as to seriously compromise the mechanical integrity of the wafer 10. Desirably, the distance 76 is kept to a minimum to prevent cross current flow between adjacent p/n junction sections.

Figure 8:
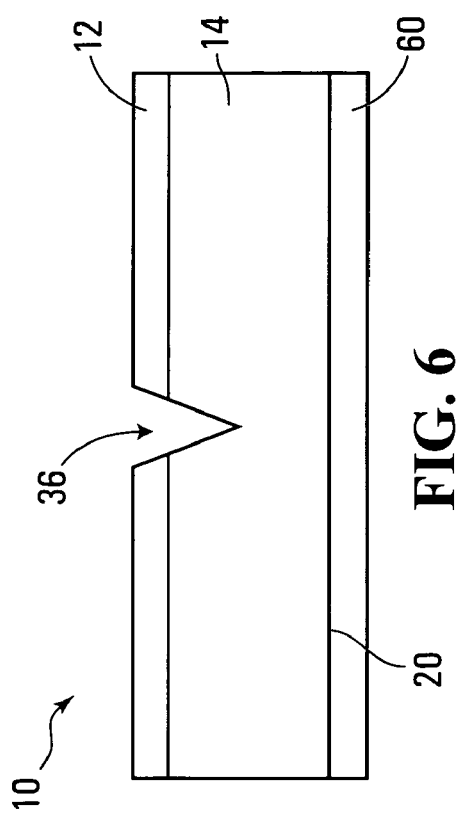
FIG. 8 is a side view of the wafer shown in FIG. 5 with a p/n junction barrier on the front side and back side metallization with a metallization groove formed therein.

Referring to FIG. 8, in the case where the p/n junction barrier 38 is used to interrupt the semiconductor p/n junction to form the first and second p/n junction sections 22 and 24, a distance 78 between the top surface 18 and the back side surface 20 of the wafer defines the bulk contacting portion 75.

Figure 9:
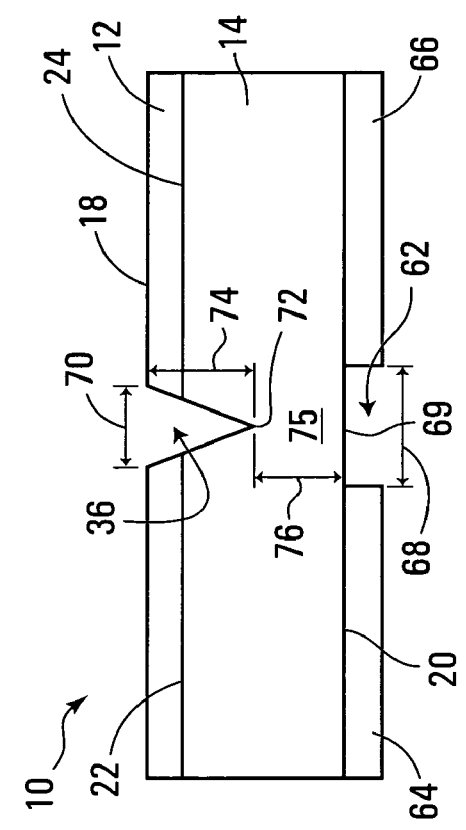
FIG. 9 is a side view of the wafer shown in FIG. 7 wherein the metallization groove has been widened and a back side groove is formed parallel, adjacent to and at an angle to the front side groove.

Referring to FIG. 9, in order to reduce current flow between adjacent p/n junction sections even further in the embodiment shown in FIG. 7, the bulk contacting portion 75 may be made more resistive by forming a back side groove 82 in the exposed portion 69 of the back side surface 20. To do this, the metallization groove 62 is widened such that the distance 68 is larger to enable the back side groove 82 to be formed in the back side surface 20 by laser cutting, wet etching or mechanical saw dicing, for example. This back side groove 82 is formed offset from the front side groove 36 such that axes 84 and 86 of the front side groove 36 and back side groove 82, respectively, lie in a plane 88 extending at an oblique angle 90 to the front side surface 18 and such that axes of the metallization groove 62 and back side groove 82 are parallel and spaced apart. In this way, a constriction 92 is formed in the bulk material which provides a relatively high resistance electrical connection between the fingers on the front side surface portion of one p/n junction section and the metallized back side surface portion of the adjacent p/n junction section, enabling each p/n junction section 22 and 24 to function more independently of each other.

Figure 10:
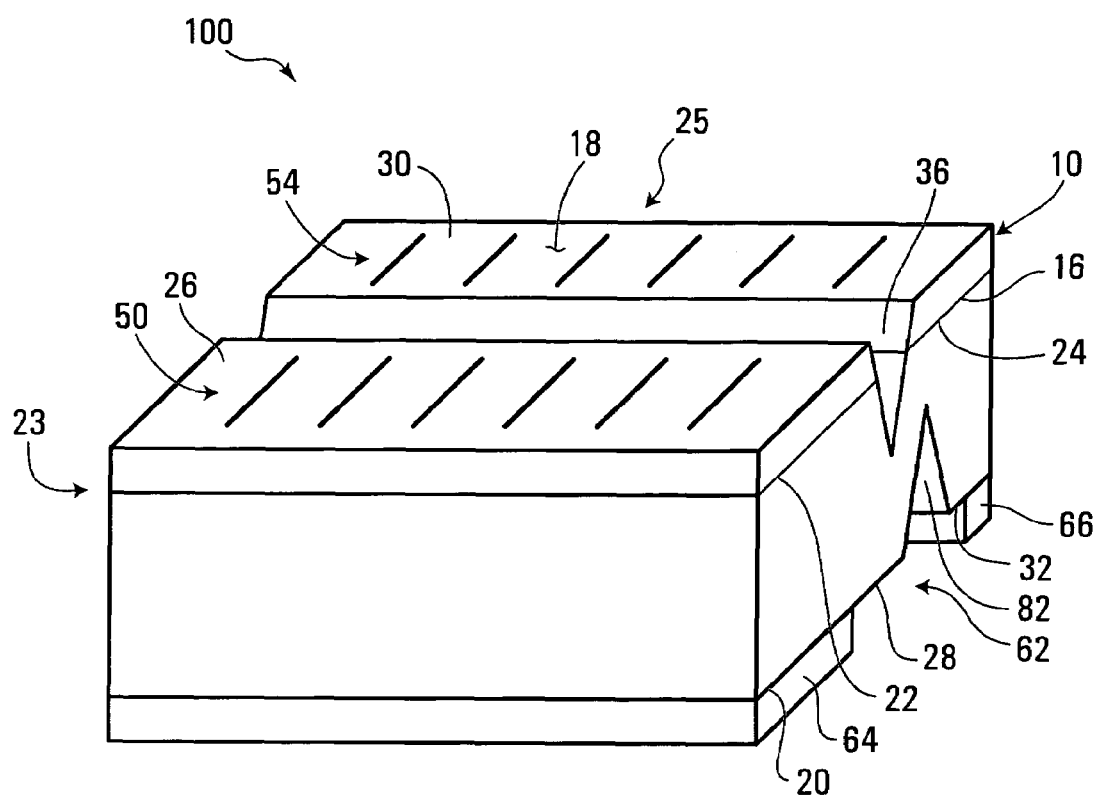
FIG. 10 is a perspective view of a completed solar cell apparatus according to the first embodiment of the invention.

Referring to FIG. 10, as a result of the process above, there is produced a solar cell apparatus as shown at 100, comprising the semiconductor wafer 10 having the front side surface 18 and the metallized back side surface 61, the semiconductor p/n junction 16 between the front side surface and the back side surface and at least one front side interruption 36 extending along at least a portion of the front side surface and extending into the wafer 10 to a depth sufficient to interrupt the semiconductor p/n junction 16 to define a plurality of separate p/n junction sections 22 and 24 within the wafer and to define separate front side surface portions 26 and 30 associated with respective separate p/n junction sections. The apparatus further includes a back side interruption 62 extending along a portion of the metallized back side surface 61, generally opposite the front side interruption 36, to define a plurality of separate metallized back side surface portions 64 and 66 associated with respective p/n junction sections 22 and 24 and in electrical contact with respective p/n junctions sections. In effect, first and second sub-cells 23 and 25, respectively, are defined on the wafer. In addition, in the embodiment shown, the apparatus 100 includes sets of current collectors which, in this embodiment, include first and second sets 50 and 54 of front side current collectors adjacent to and in electrical contact with a corresponding p/n junction section 22 and 24.

The apparatus shown in FIG. 10 includes the front side groove 36, metallization groove 62 and back side groove 82 shown in FIG. 9, although it will be appreciated that, in general, the apparatus may alternatively include configurations such as shown in FIGS. 7 or 8 or other equivalent configurations and/or may include a plurality of front side and back side interruptions 36 and 82 to define a plurality of separate p/n junction sections including more than the two p/n junction sections shown in FIG. 10.

Figure 11:
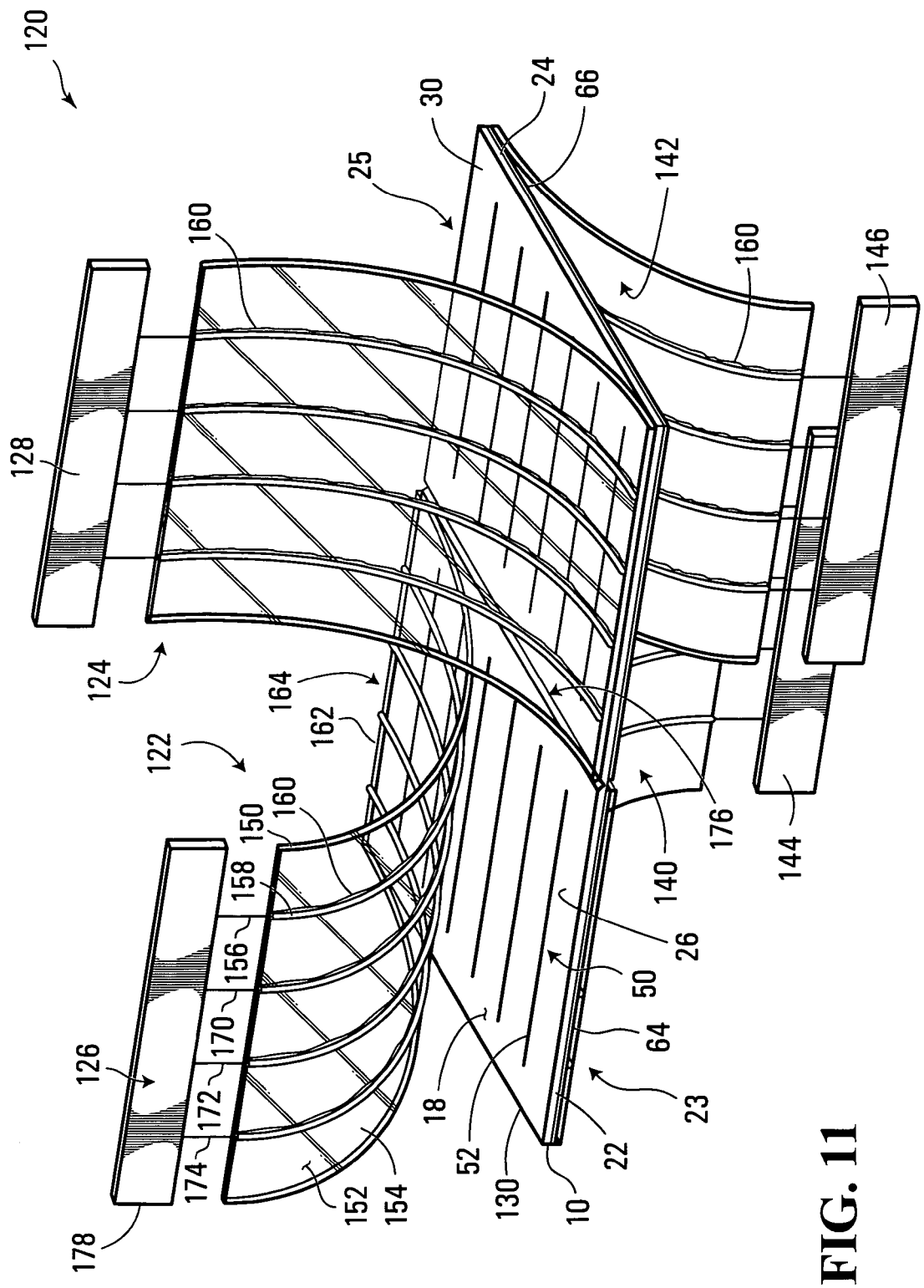
FIG. 11 is a perspective view of a process for connecting electrodes to the apparatus shown in FIG. 10.

Referring to FIG. 11, a process for fabricating a solar cell module for use in a high voltage solar cell, according to another aspect of the invention, is shown generally at 120. The process 120 involves connecting front side electrodes, in this case first and second front side electrodes 122 and 124, to respective sets of current collectors 50 and 54 on the front sides 26 and 30 of respective sub-cells 23 and 25. Each front side electrode 122 and 124 includes a front side terminator 126 and 128, respectively, that is located outside a perimeter 130 of the semiconductor wafer 10, i.e., off the wafer, for connecting the corresponding sub-cell 23 and 25 to a circuit including other electrical equipment such as another sub-cell of an adjacent semiconductor wafer or another solar cell module, or another solar cell, for example.

Figure 13:
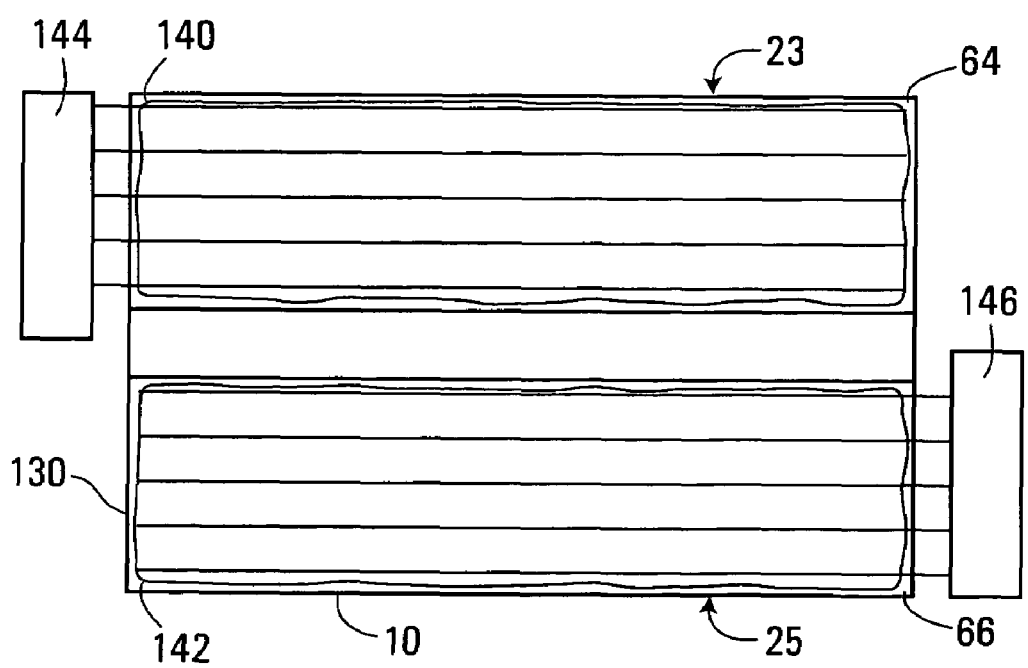
FIG. 13 is a bottom view of the apparatus shown in FIG. 12 wherein the front side electrodes have been omitted for clarity and back side electrodes are shown.

The process 120 further includes connecting back side electrodes a first of which is shown at 140 in FIG. 11 and a second of which is shown at 142 in FIG. 11, connected to the first and second metallized back side surface portions 64 and 66, respectively, on the back side of the semiconductor wafer 10 and associated with a respective sub-cell 23 and 25. Each back side electrode 140 and 142 includes a back side terminator 144 and 146, respectively, which, as shown in FIG. 13, is positioned outside the perimeter 130 of the semiconductor wafer 10, for connecting the corresponding sub-cell to other electrical equipment such as another sub-cell, another solar cell module, or another solar cell, for example.

In the embodiment shown, each front side electrode 122, 124 and back side electrode 140, 142 comprises an electrically insulating optically transparent film 150 having a surface 152 and an adhesive layer 154 on the surface. The electrode further includes at least one electrical conductor 156 embedded into the adhesive layer 154 such that the at least one electrical conductor 156 has a conductor surface 158 protruding from the adhesive layer. An alloy 160 is applied to the conductor surface 158 and is operable to bond the at least one electrical conductor 156 to at least some of the current collectors (52) in the set of current collectors associated with the corresponding sub-cell, in the case of the front side electrodes 122 and 124. In the case of the back side electrodes 140 and 142, the alloy 160 is operable to bond the at least one electrical conductor to a metallized back side surface portion 64 or 66. The semiconductor wafer 10 with the electrodes 122, 124, 140 and 142 thereon may then be heated to cause the alloy 160 to bond the at least one electrical conductor 156 to the respective set of current collectors or metallized back side portion.

In the embodiment shown, the alloy 160 bonding the electrical conductor 156 to at least some of the current collectors may include a material that may be heated to solidify and electrically bond and connect the electrical conductor 156 to the set 50 of current collectors 52. The alloy may be a coating on the conductor surface 158, for example. The alloy may be a solder, for example.

In the embodiment shown in FIG. 11, the electrode 122 includes electrical conductors including conductor 156 and conductors 170, 172 and 174. The conductors 156, 170, 172 and 174 are, in this embodiment, laid out in parallel evenly spaced apart relation on the adhesive layer 154 of the electrode 122. The greater the number of electrical conductors, the greater the current carrying capacity of the electrode 122.

Initially, the front side electrode 122 may be curled as shown in FIG. 11 to align a rear edge 162 of the electrode with a rear edge 164 of the semiconductor wafer 10 and then the film 150, with its adhesive layer 154 with the conductors 156, 170, 172 and 174 embedded therein, may be pressed downwardly onto the front side surface 26 of the first sub-cell 23 to roll out the electrode 122 and secure the adhesive layer to the front side surface 26, such that the electrical conductors 156, 170, 172 and 174 come into contact with the current collectors 52.

Alternatively, if the current collectors 52 were to have been formed to extend in a direction at right angles to the direction shown, the rear edge 162 of the electrode 122 may be aligned with a right hand side edge 176 of the semiconductor wafer 10 and rolled out across the front side surface 26 of the semiconductor wafer 10 in a manner such that the conductors 156, 170, 172 and 174 come into contact with the current collectors 52.

In the embodiment shown, the electrical conductors 156, 170, 172 and 174 extend beyond the optically transparent film 122 and are terminated to a common bus 178, which may be formed of metallic foil, such as copper, for example, which acts as the front side terminator 126.

The back side electrodes 140 and 142 are similar to the front side electrodes 122 in all respects and a plurality of the above described electrodes may be pre-manufactured and individual ones applied to the respective front side surfaces (e.g., 26 and 30) and back side electrical contacts (e.g., 64, 66) as desired. It should be noted however that the back side electrodes 140 and 142 need not be optically transparent like the front side electrodes 122 and 124 since the back side surface of the wafer 10 is not intended to receive light.

Further details of general and alternate constructions of the front side electrodes 122 and 124 and back side electrodes 140 and 142 may be obtained from applicant's International Patent Application published under International Publication Number WO 2004/021455A1, which is incorporated herein by reference.

Figure 12:
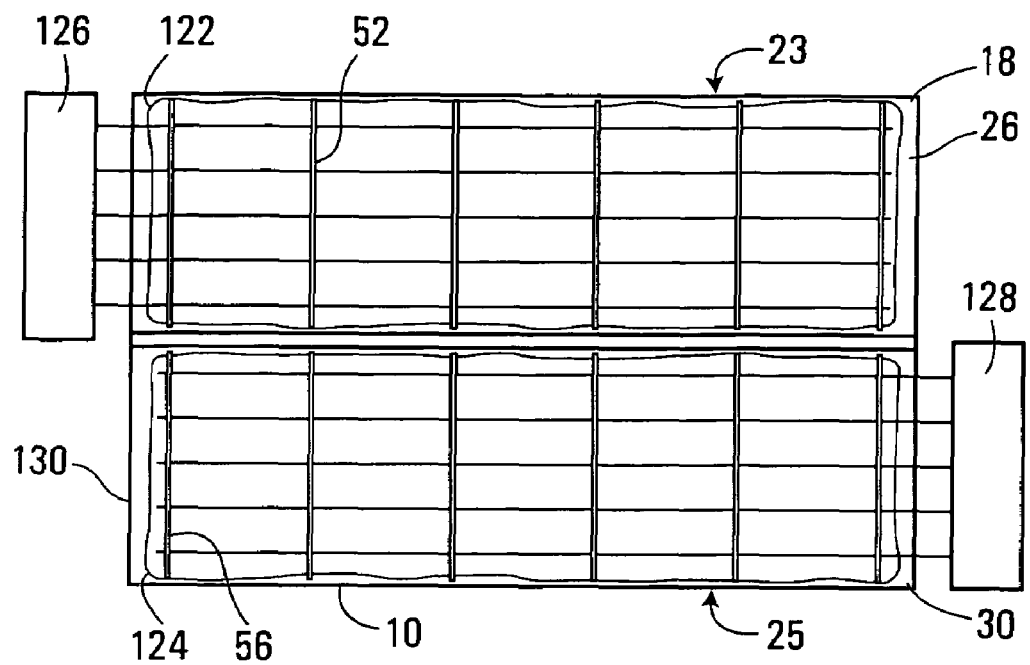
FIG. 12 is a top plan view of the apparatus shown in FIG. 11 after front side electrodes have been connected thereto.

Referring to FIG. 12, after connecting the electrodes 122, 124, 140, 142 as described with reference to FIG. 11, the semiconductor wafer 10 has, on its front side surface 18, the first front side electrode 122 on the front side 26 of the first sub-cell 23 and the second front side electrode 124 on the front side 30 of the second sub-cell 25. The first and second front side electrodes 122 and 124 are positioned such that their respective terminating portions 126 and 128 are positioned on opposite sides of the wafer 10.

Figure 14:
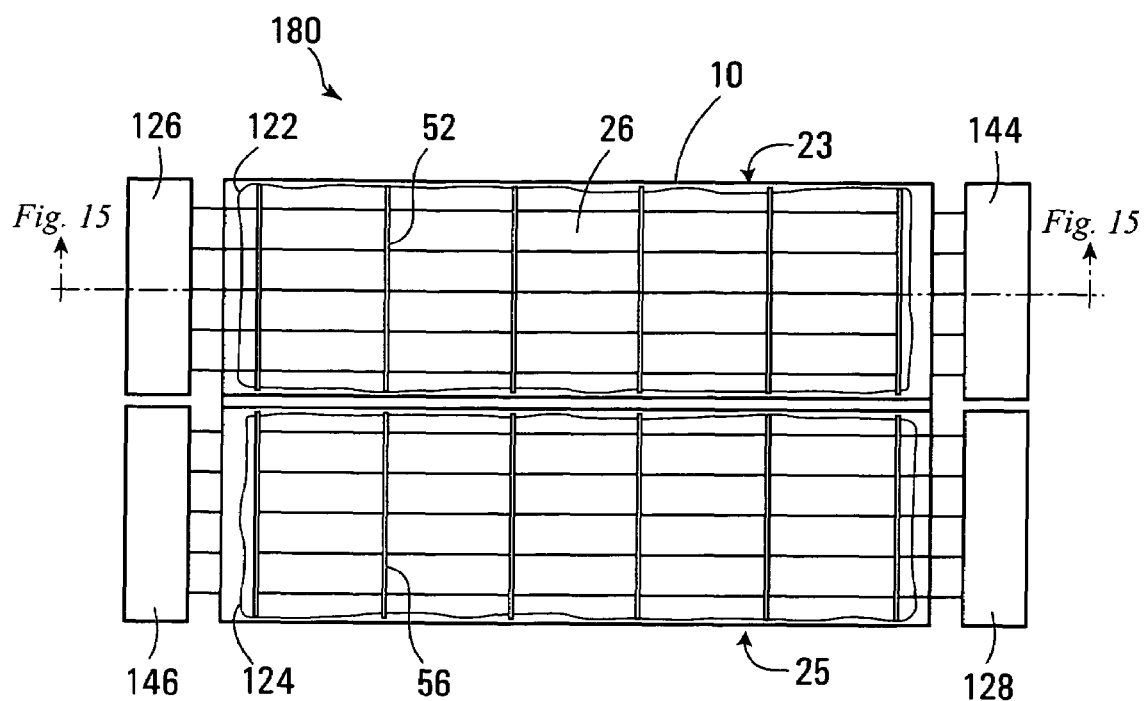
FIG. 14 is a top plan view of a solar cell module formed by the process shown in FIG. 11.

Similarly, referring to FIG. 13, the first and second back side electrodes 140 and 142 are positioned on the first and second metallized surface portions 64 and 66, respectively, such that respective terminating portions 144 and 146 also extend on opposite sides of the semiconductor wafer 10. The wafer 10 with the electrodes 122, 124, 140 and 142 thereon may be regarded as a solar cell module shown generally at 180 in top plan view in FIG. 14.

Figure 15:
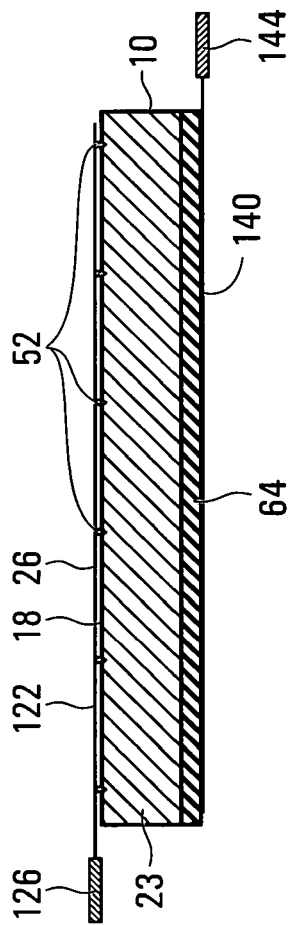
FIG. 15 is a cross-sectional view taken along lines 15-15 of FIG. 14 showing the solar cell module of FIG. 14 wherein the front side electrode and back side electrode lie in separate spaced apart planes.
Figure 16:
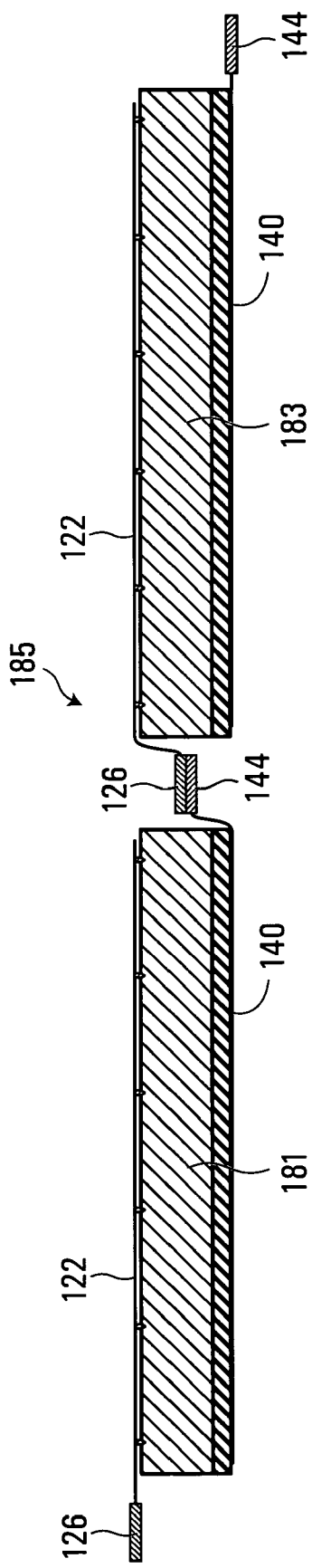
FIG. 16 is a cross-sectional view of a solar cell system formed by connecting the front side electrode of the solar cell shown in FIGS. 14 and 15 to a back side electrode of an adjacent similar solar cell module to produce a solar cell system.

Referring to FIG. 15, it should be appreciated that the first front side terminator 126 extends generally in the plane of the front side surface 26 of the first sub-cell 23 and the first back side terminator 144 extends generally in the plane of the first metallized back side surface portion 64. As shown in FIG. 16, this enables the front side terminator 126 to conveniently and easily contact a back side terminator 144 of an adjacent module of the same type, whereby two adjacent sub-cells 181 and 183 of different wafers are connected in series to produce a solar cell system. FIG. 16 thus depicts a solar cell system 185 comprised of two adjacent modules of the type shown in FIGS. 14 and 15, electrically connected together in series.

It will be appreciated that in one embodiment the front side terminators for sub-cells on a given wafer all generally extend in the same plane while all of the back side terminators for the sub-cells on the same wafer extend in a common plane which is parallel and spaced apart from the plane in which the front side terminators extend. This facilitates easy electrical connection of adjacent solar cell modules of the type described, as the front side terminators can be made to overlap with back side terminators of adjacent modules as shown in FIG. 16. The terminators 126 and 144 can be coated with a low melting point alloy, for example, and heated, while being forced together by an applied pressure, to solder them together. This can be done quite readily with automated machinery, thereby further reducing the costs of manufacturing a solar cell system using the modules described herein.

Figure 17:
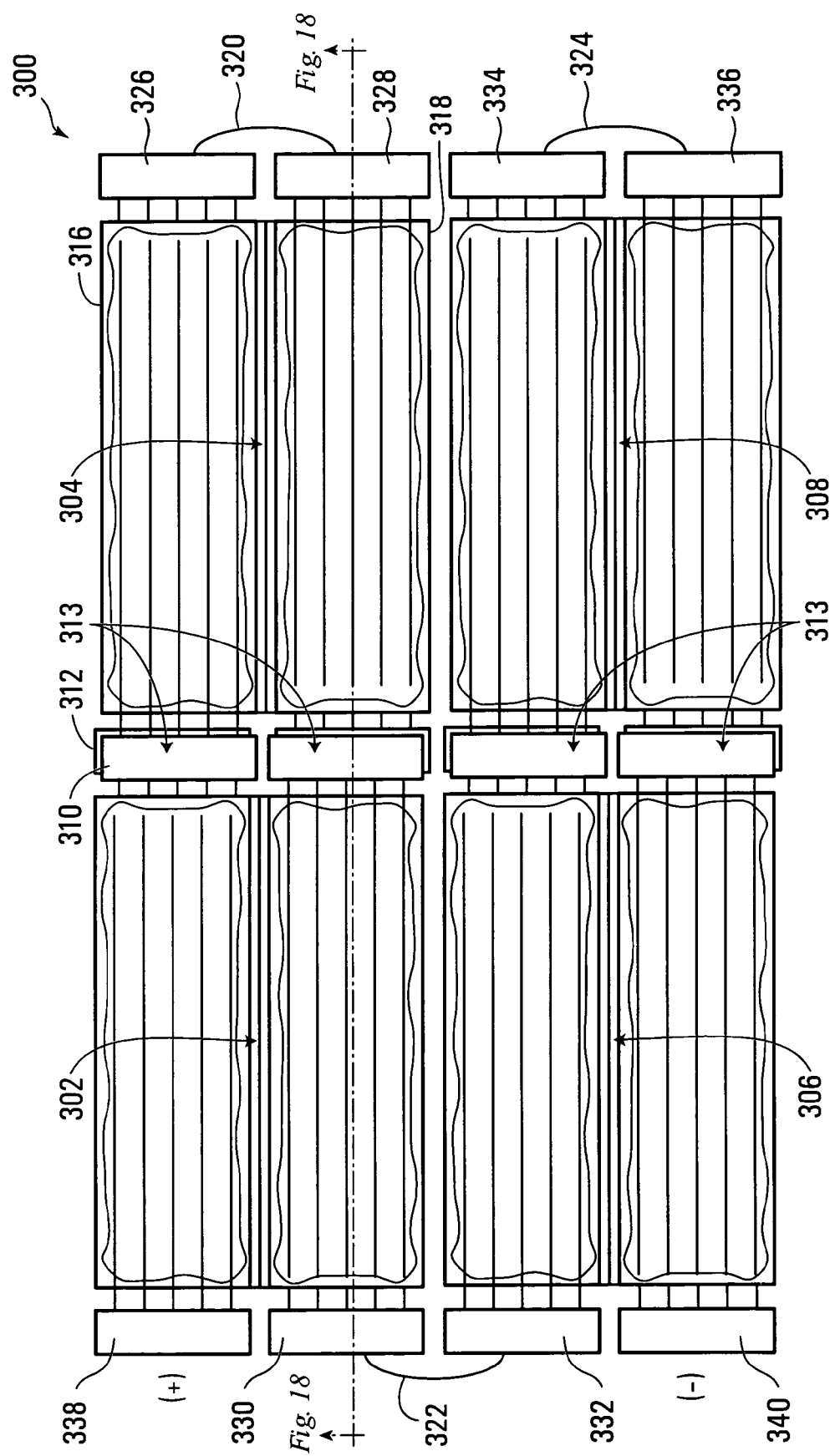
FIG. 17 is a schematic representation of a solar cell system comprising a plurality of solar cell modules of the type shown in FIG. 14, electrically connected together in series.

As shown in FIG. 17, a solar cell system 300 comprising four solar cell modules shown generally at 302, 304, 306 and 308 may be fabricated. These solar cell modules are of the type shown in FIGS. 14 and 15, that have two sub-cells. To connect side-by-side adjacent modules 302 and 304, a front side terminator 310 of the second module 304 overlaps a back side terminator 312 of the first module 302 and the front side terminator and back side terminator are soldered together to form a side connection 313.

Figure 18:
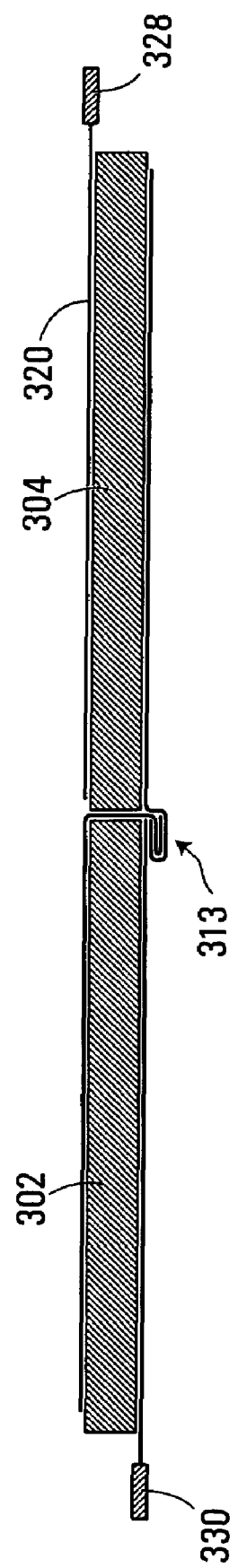
FIG. 18 is a cross-sectional view of the system shown in FIG. 17 with side connections shown folded under modules.

Referring to FIG. 18, the side connections 313 may be folded under the modules 302 and 304, to enable the modules to be abutted closely together thereby reducing inactive or non-electricity producing areas between modules and keeping the overall size of the system to a minimum.

Referring back to FIG. 17, to connect adjacent sub-cells of top and bottom adjacent modules and to connect top and bottom adjacent sub-cells on the same module together in series, wires 320, 322 and 324 may be connected to adjacent terminators 326 and 328, 330 and 332, and 334 and 336, respectively. Terminators 338 and 340 form positive (+) and negative (−) terminators respectively for the solar cell system 300.

The solar cell system 300 may be housed within a single enclosure and when connected together in series in the manner shown, or by using other connection methods, provides a solar cell system having an output voltage much higher than that provided by a single solar cell. For example, each sub-cell shown in FIG. 17 generates current at an output voltage of approximately 500 millivolts at maximum power output. There are eight semiconductor sections shown in FIG. 17 and thus the voltage output across the terminators 338 and 340 of the solar cell system 300 is 4.0 volts. It will be appreciated that a plurality of modules of the type shown may be connected in series to achieve an output voltage of any desired multiple of 500 millivolts.

Figure 19:
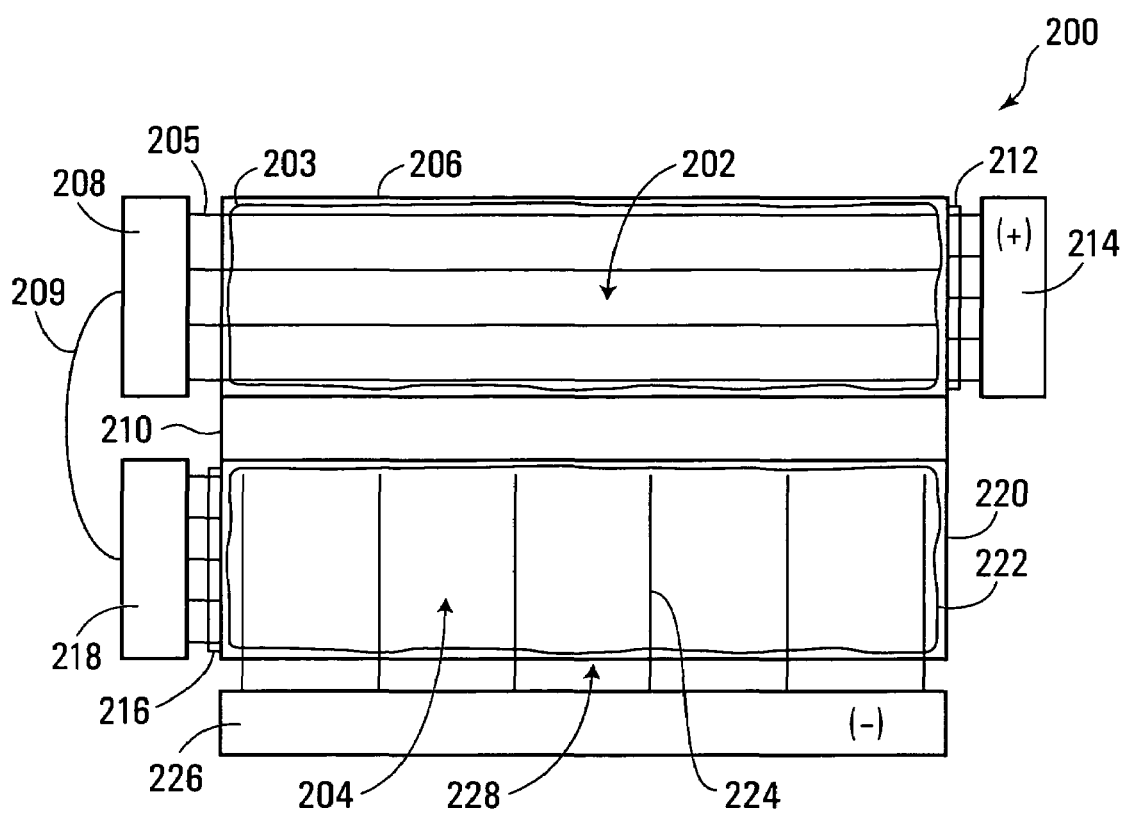
FIG. 19 is a bottom view of the apparatus shown in FIG. 10 where the apparatus includes a back side electrode according to an alternative embodiment of the invention.

Referring to FIG. 19, a solar cell module according to an alternative embodiment is shown generally at 200 and comprises first and second sub-cells 202 and 204, respectively, formed in a manner similar to those described in connection with the embodiments above. The module has a first back side electrode 203 on a metallized back side surface 206 associated with the first sub-cell 202. The electrode 203 has a back side terminator 208 that extends beyond a perimeter 210 of the module 200. The first sub-cell 202 also has a front side surface (not shown), to which a front side electrode 212 is electrically connected such that a front side terminator 214 extends beyond the perimeter 210 of the module on an opposite side of the module 200.

Similarly, the second sub-cell 204 has a front side electrode 216 on a front side (not shown) thereof with a terminator 218 that extends beyond the perimeter 210 of the module 200, on the same side as the back side terminator 208 of the first sub-cell 202. However, in this embodiment, the second sub-cell 204 has a physically isolated metallized exterior surface portion 220 to which is connected an electrode 222 having a plurality of conductors, one of which is shown at 224, that extend in a direction perpendicular to the direction of the conductors 205 of the back side electrode 204 connected to the first sub-cell 202. These conductors 224 are terminated in a longer, second back side terminator 226 that extends parallel to a long edge 228 of the module 200. More particularly, the second back side terminator 226 is oriented at a right angle to the other terminators associated with the module. This longer second back side terminator 226, in the orientation shown, may make the module 200 more suitable than the module shown in FIG. 14, for example, for use as a final module in a series string of modules in a solar cell system.

The back side terminator 208 of the first sub-cell 202 is connected by a wire 209 to the front side terminator 218 of the second sub-cell 204 to connect the two sub-cells together in series. The front side terminator 214 of the first sub-cell 202 thus acts as a positive terminal of the module and the back side terminator 226 of the second sub-cell 204 acts as a negative terminal of the module.

Referring to FIG. 20, a solar cell module according to another embodiment of the invention is shown generally at 250 and includes first, second, third and fourth sub-cells 252, 254, 256 and 258 which are interrupted or separated from each other by first, second and third front side interruptions such as grooves 260, 262 and 264 extending parallel and evenly spaced apart on a front side surface 266 of a single semiconductor wafer 268, and by corresponding back side interruptions on the back side surface. Front and back side electrodes, representative ones of which are shown at 270 and 272, for example, are connected to the front and back side respectively of each sub-cell 252, 254, 256 and 258 and each has a front side terminator 274 and a back side terminator 276. The front and back front side terminators 274 and 276 may be connected together using wires 251, 253 and 255 as shown, to connect each individual sub-cell 252, 254, 256 and 258 in series to provide a single module with a voltage output across the terminators 278 and 274 that is approximately four times the voltage output of a single sub-cell.

From the foregoing, it will be appreciated that each sub-cell in all of the embodiments described above is connected to an adjacent or other sub-cell or other electronic equipment, using the terminators which extend outside the perimeter of the wafer itself. The use of the electrodes with terminators that extend outside the perimeter of the wafer itself facilitates easy fabrication of solar cell modules without requiring semiconductor fabrication techniques to connect adjacent sub-cells on the same wafer together as has been the practice in the prior art. This simplification in fabricating solar cell modules may reduce the cost of manufacturing.

Experimentation has shown that the distance between an edge of the semiconductor wafer and the nearest groove or recess or between adjacent recesses on the same side of the wafer delineating sub-cells, is desirably not less than 3 centimetres to avoid shunting through the bulk contacting area, between adjacent sub-cells. It seems that as the distance becomes less than 3 centimetres, the efficiency of the sub-cells tends to decrease to the point of making the wafer no longer economically viable. It will be appreciated, however, that if economic viability is not a concern, then the distance between an edge or adjacent recesses in the front side or adjacent recesses in the back side may be less than 3 centimetres.

It also has been found that a semiconductor wafer of a given area produces electricity at a certain output power. It also has been found that even if the same semiconductor wafer has an interrupted p/n junction and interrupted back side metallization as described above, the output power of the overall wafer is virtually the same as the output power before the p/n junction and back side metallization was interrupted. For example, if a single wafer is divided into two equal sub-cells as described above, and the two sub-cells are connected together in series, the current output of the overall module is about one-half the current output of the wafer before the sub-cells were formed and the open circuit voltage is approximately twice the open circuit voltage of the wafer before the sub-cells were formed.

While specific embodiments of the invention have been described and illustrated, such embodiments should be considered illustrative of the invention only and not as limiting the invention as construed in accordance with the accompanying claims.

What is claimed is:

1. A solar cell apparatus comprising:
a semiconductor wafer having:
a front side surface and a metallized back side surface:
a semiconductor p/n junction between said front side surface and said back side surface:
at least one front side interruption extending along at least a portion of said front side surface and extending into said wafer to a depth sufficient to interrupt said semiconductor p/n junction to define a plurality of separate p/n junction sections within the wafer and to define separate front side surface portions associated with respective said separate p/n junction sections; and
a back side interruption extending along a portion of said metallized back side surface and extending into said metallized back side surface, generally opposite said front side interruption, such that a semiconducting bulk contacting portion of said wafer separates said front side interruption from said back side interruption, to define a plurality of separate portions of said semiconductor wafer connected together only by said bulk contacting portion, said separate portions including metallized back side surface portions associated with respective said p/n junction sections and in electrical contact with respective said p/n junction sections.

2. The apparatus of claim 1 wherein said front side interruption comprises at least one front side recess.

3. The apparatus of claim 2 wherein said at least one front side recess comprises a front side groove in said front side surface.

4. The apparatus of claim 3 wherein said wafer has a perimeter edge and wherein said front side groove extends between two points on said perimeter edge.

5. The apparatus of claim 4 wherein said two points are on opposite edges of said wafer.

6. The apparatus of claim 3 wherein said back side interruption comprises at least one metallization recess in said metallized back side surface, said metallization recess exposing an exposed portion of said back side surface of said wafer.

7. The apparatus of claim 6 wherein said metallization recess comprises a metallization groove.

8. The apparatus of claim 7 wherein said front side groove and said metallization groove are generally parallel to each other.

9. The apparatus of claimed 7 wherein said metallization groove has a width greater than a width of said front side groove.

10. The apparatus of claim 6 wherein said back side interruption comprises a back side groove in said exposed portion of said back side surface.

11. The apparatus of claim 10 wherein said front side groove and said back side groove have axes that lie in a plane extending at an oblique angle to said front side surface.

12. The apparatus of claim 10 wherein said metallization recess and said back side groove have axes that are parallel and spaced apart.

13. The apparatus of claim 1 further comprising respective sets of current collectors on respective front side surface portions, each of said respective sets of current collectors being in electrical contact with a respective p/n junction section.

14. The apparatus of claim 13 wherein said current collectors in each set include separate electrical contacts in said front side surface.

15. The apparatus of claim 14 wherein said current collectors are arranged in an array.

16. The apparatus of claim 15 wherein said current collectors include a plurality of parallel spaced-apart fingers.

17. The apparatus of claim 13 further comprising front side electrodes connected to respective said sets of current collectors, each front side electrode comprising a front side terminator outside a perimeter of said semiconductor wafer, for connecting said corresponding semiconductor p/n junction section to a circuit.

18. The apparatus of claim 17 wherein each of said front side electrodes comprises at least one conductor having a portion extending outside a perimeter of said semiconductor wafer and wherein said front side terminators associated with respective said front side electrodes include respective said portions extending outside said perimeter of said semiconductor wafer.

19. The apparatus of claim 17 wherein each of said front side terminators comprises a respective front side bus and wherein each of said front side electrodes comprises a plurality of spaced apart electrical conductors each connected to a common front side bus.

20. The apparatus of claim 19 wherein said conductors of said plurality of conductors have terminating portions that extend beyond a perimeter edge of said semiconductor wafer and wherein said conductors have portions that are connected to said front side bus.

21. The apparatus of claim 20 wherein each of said front side electrodes comprises an electrically insulating optically transparent film having a surface, an adhesive layer on said surface of said film for securing the film to a corresponding front side surface portion, and wherein said plurality of spaced apart electrical conductors are embedded into the adhesive layer and wherein said electrical conductors each have a conductor surface protruding from said adhesive layer, and an alloy bonding said electrical conductors to at least some of said electrical contacts such that current collected from said solar cell by said electrical contacts is gathered by said electrical conductors.

22. The apparatus of claim 17 wherein each of said separate metallized back side surface portions comprises metallization generally coextensive with and adjacent to a corresponding p/n junction section and in electrical contact therewith.

23. A high voltage solar cell module comprising the apparatus of claim 22 and further comprising back side electrodes connected to respective said metallized back side surface portions, each back side electrode comprising a back side terminator outside a perimeter of said semiconductor wafer, for connecting said corresponding semiconductor p/n junction section to the circuit.

24. The high voltage solar cell module of claim 23 wherein each of said back side electrodes comprises at least one conductor having a portion extending outside a perimeter of said semiconductor wafer and wherein said back side terminators associated with respective said back side electrodes include respective said portions extending outside the perimeter of the wafer.

25. The high voltage solar cell module of claim 23 wherein each of said back side terminators comprises a respective back side bus and wherein each of said back side electrodes comprises a plurality of spaced apart electrical conductors each connected to a common back side bus.

26. The high voltage solar cell module of claim 25 wherein said conductors of said plurality of conductors have terminating portions that extend beyond a perimeter edge of said semiconductor wafer and wherein said conductors have portions that are connected to said back side bus.

27. The high voltage solar cell module of claim 23 wherein said back side electrode comprises an electrically insulating film having a surface, an adhesive layer on said surface of said film for securing the film to a corresponding metallized back side surface portion, and wherein at least one electrical conductor is embedded into the adhesive layer and wherein said at least one electrical conductor has a conductor surface protruding from said adhesive layer, and an alloy bonding said at least one electrical conductor to said corresponding metallized back side surface portion such that current supplied to said solar cell is supplied to said corresponding metallized back side surface by said at least one electrical conductor.

28. A solar cell system comprising the solar cell module recited in claim 23 and further comprising means for electrically connecting a front side terminator associated with a first semiconductor p/n junction section in the wafer with a back side terminator of a second semiconductor p/n junction section to electrically connect said first and second semiconductor p/n junction sections in series.

29. The solar cell system of claim 28 wherein said means for electrically connecting said front side terminator associated with said first semiconductor p/n junction section with said back side terminator of said second semiconductor p/n junction section is operably configured to directly connect said front side terminator associated with said one semiconductor p/n junction section with said back side terminator associated with said second semiconductor p/n junction.

30. A solar cell system comprising first and second solar cell apparatus, each as recited in claim 23, disposed adjacent each other, and further comprising means for electrically connecting a front side terminator associated with a semiconductor p/n junction on said first apparatus with a back side terminator associated with a semiconductor p/n junction section on said second solar cell apparatus.

31. A process for fabricating a solar cell apparatus from a semiconductor wafer having a front side surface, a metallized back side surface and a p/n semiconductor junction there between, the process comprising:

causing a front side interruption to extend along at least a portion of said front side surface and to extend into said wafer to a depth sufficient to interrupt said semiconductor p/n junction to define a plurality of separate p/n junction sections within the wafer and to define separate front side surface portions associated with respective said separate p/n junction sections; and causing a back side interruption to extend along a portion of said metallized back side surface and extend into said metallized back side surface, generally opposite said front side interruption, such that a semiconducting bulk contacting portion of said wafer separates said front side interruption from said back side interruption, to define a plurality of separate portions of said semiconductor wafer connected together only by said bulk contacting portion, said separate portions including metallized back side surface portions associated with respective said p/n junction sections and in electrical contact with respective said p/n junction sections.

32. The process of claim 31 wherein causing a front side interruption to extend along at least a portion of said front side surface comprises forming at least one front side recess in said front side surface.

33. The process of claim 32 wherein forming said at least one front side recess comprises forming a front side groove in said front side surface.

34. The process of claim 33 wherein said wafer has a perimeter edge and wherein forming said front side recess comprises causing said front side recess to extend between two points on said perimeter edge.

35. The process of claim 34 wherein causing said front side recess to extend between two points on said perimeter edge comprises causing said front side recess to extend between two points on opposite edges of said wafer.

36. The process of claim 33 wherein causing said back side interruption to extend along a portion of said back side metallized surface comprises forming at least one metallization recess in said metallized back side surface, said metallization recess exposing an exposed portion of said back side surface of said wafer.

37. The process of claim 36 wherein forming said back side recess comprises forming a metallization groove in said metallized back side surface.

38. The process of claim 37 wherein forming said front side groove and forming said metallization groove comprises causing said front side groove and said metallization groove to be generally parallel to each other.

39. The process of claim 37 wherein forming said front side groove and said metallization groove comprises causing said metallization groove to have a width greater than a width of said front side groove.

40. The process of claim 36 wherein causing said back side interruption to extend along a portion of said metallized back side surface comprises forming a back side groove in said exposed portion of said back side surface.

41. The process of claim 40 wherein forming said back side groove comprises forming said front side groove and said back side groove such that said front side groove and said back side groove have axes that lie in a plane extending at an oblique angle to said front side surface.

42. The process of claim 40 wherein forming said back side groove comprises forming said back side groove such that said metallization recess and said back side groove have axes that are parallel and spaced apart.

43. The process of claim 31 further comprising forming respective sets of current collectors on respective front side surface portions, each of said respective sets of current collectors being in electrical contact with a respective p/n junction section.

44. The process of claim 43 wherein forming said current collectors in each set comprises forming separate electrical contacts in each set, in said front side surface.

45. The process of claim 44 wherein forming said electrical contacts comprises causing said electrical contacts to be arranged in an array.

46. The process of claim 45 wherein forming said current collectors comprises forming a plurality of parallel spaced-apart fingers.

47. The process of claim 43 further comprising connecting front side electrodes to respective said sets of current collectors, each front side electrode comprising a front side terminator outside a perimeter of said semiconductor wafer, for connecting said corresponding semiconductor p/n junction section to a circuit.

48. A process for fabricating a high voltage solar cell module, the process comprising the process of claim 47 and further comprising connecting back side electrodes to respective said metallized back side surface portions, each back side electrode comprising a back side terminator outside a perimeter of said semiconductor wafer, for connecting said corresponding semiconductor p/n junction section to the circuit.

49. A process for fabricating a solar cell system, the process comprising the process recited in claim 48 and further comprising electrically connecting a front side terminator associated with a first semiconductor p/n junction section in the wafer with a back side terminator of a second semiconductor p/n junction section in the wafer to electrically connect said first and second semiconductor p/n junction sections in series.

50. The process of claim 49 wherein electrically connecting said front side terminator associated with said first semiconductor p/n junction section with said back side terminator associated with said second semiconductor p/n junction section comprises directly connecting said front side terminator associated with said first semiconductor p/n junction section with said back side terminator associated with said second semiconductor p/n junction.

51. A process for fabricating a high voltage solar cell system, using a solar cell module comprising a semiconductor wafer having a front side surface, a metallized back side surface, a semiconductor p/n junction between said front side surface and said back side surface, at least one front side interruption extending along at least a portion of said front side surface and extending into said wafer to a depth sufficient to interrupt said semiconductor pin junction to define a plurality of separate p/n junction sections within the wafer and to define separate front side surface portions associated with respective said separate p/n junction sections, a back side interruption extending along a portion of said metallized back side surface and extending into said metallized back side surface, generally opposite said front side interruption, such that a semiconducting bulk contacting portion of said wafer separates said front side interruption from said back side interruption, to define a plurality of separate portions of semiconductor wafer connected together by said bulk contacting portion, said separate portions including metallized back side surface portions associated with respective said p/n junction sections and in electrical contact with respective said p/n junction sections, respective sets of current collectors on respective front side surface portions, each of said respective sets of current collectors being in electrical contact with a respective p/n junction section, front side electrodes connected to respective said sets of current collectors, each front side electrode comprising a front side terminator outside a perimeter of said semiconductor wafer, for connecting said corresponding semiconductor p/n junction section to a circuit and back side electrodes connected to respective said metallized back side surface portions, each back side electrode comprising a back side terminator outside a perimeter of said semiconductor wafer, for connecting said corresponding semiconductor p/n junction section to the circuit, the process comprising:
  connecting one of said front side terminators associated with a first semiconductor p/n junction section to one of said back side terminators of a back side electrode associated with a second p/n junction section.

52. The process of claim 51 wherein connecting one of said front side terminators associated with a first semiconductor p/n junction section to one of said back side terminators of a back side electrode associated with a second p/n junction section comprises connecting one of said front side terminators associated with a first semiconductor p/n junction section to one of said back side terminators of a back side electrode associated with a second p/n junction section on the same wafer.

53. The process of claim 51 wherein connecting one of said front side terminators associated with a first semiconductor p/n junction section to one of said back side terminators of a back side electrode associated with a second p/n junction section comprises connecting one of said front side terminators associated with a first semiconductor p/n junction section to one of said back side terminators of a back side electrode associated with a second p/n junction section on a different wafer.

* * * * *

UNITED STATES PATENT AND TRADEMARK OFFICE
CERTIFICATE OF CORRECTION

PATENT NO. : 7,498,508 B2
APPLICATION NO. : 11/361296
DATED : March 3, 2009
INVENTOR(S) : Rubin et al.

It is certified that error appears in the above-identified patent and that said Letters Patent is hereby corrected as shown below:

Column 2, Lines 21-22, "multifunction solar" should be changed to --multijunction solar--

Column 18, Line 51, "of claimed 7" should be changed to --of claim 7--

Column 22, Line 18, "semiconductor pin junction" should be changed to --semiconductor p/n junction--

Signed and Sealed this

Eleventh Day of August, 2009

David J. Kappos
*Director of the United States Patent and Trademark Office*